(12) United States Patent
Kitamura

(10) Patent No.: US 11,728,377 B2
(45) Date of Patent: Aug. 15, 2023

(54) SEMICONDUCTOR DEVICE

(71) Applicant: FUJI ELECTRIC CO., LTD., Kawasaki (JP)

(72) Inventor: Shoji Kitamura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 49 days.

(21) Appl. No.: 17/496,586

(22) Filed: Oct. 7, 2021

(65) Prior Publication Data

US 2022/0037462 A1   Feb. 3, 2022

Related U.S. Application Data

(63) Continuation of application No. 15/250,998, filed on Aug. 30, 2016, now Pat. No. 11,257,900, which is a
(Continued)

(30) Foreign Application Priority Data

Sep. 17, 2014   (JP) .................................. 2014-189477

(51) Int. Cl.
*H01L 29/36* (2006.01)
*H01L 29/06* (2006.01)
(Continued)

(52) U.S. Cl.
CPC ...... *H01L 29/0619* (2013.01); *H01L 29/0615* (2013.01); *H01L 29/0692* (2013.01);
(Continued)

(58) Field of Classification Search
CPC ............. H01L 29/0619; H01L 29/0615; H01L 29/0692; H01L 29/1608; H01L 29/872; H01L 29/36
(Continued)

(56) References Cited

U.S. PATENT DOCUMENTS 4,602,266 A   7/1986 Coe
4,742,377 A   5/1988 Einthoven
(Continued)

FOREIGN PATENT DOCUMENTS

JP   2008-034646 A   2/2008
JP   2009-105110 A   5/2009
(Continued)

*Primary Examiner* — Ori Nadav
(74) *Attorney, Agent, or Firm* — Rabin & Berdo, P.C.

(57) ABSTRACT

A semiconductor device, including a substrate of a first conductivity type, an active region and a termination structure portion formed on a front surface of the substrate, and a plurality of regions of a second conductivity type formed concentrically surrounding the periphery of the active region in the termination structure portion. Each region has a higher impurity concentration than one of the regions adjacent thereto on an outside thereof. The plurality regions include first and second semiconductor regions, and an intermediate region sandwiched between, and in contact with, the first and second semiconductor regions, and a third semiconductor region. The intermediate region includes a plurality of first subregions and a plurality of second subregions that are alternately arranged along a path in parallel to a boundary between the active region and the termination structure portion, the second subregions having a lower impurity concentration than the first subregions.

18 Claims, 28 Drawing Sheets

Related U.S. Application Data continuation of application No. PCT/JP2015/076370, filed on Sep. 16, 2015.

(51) Int. Cl.
  *H01L 29/872* (2006.01)
  *H01L 29/16* (2006.01)

(52) U.S. Cl.
  CPC ........ *H01L 29/1608* (2013.01); *H01L 29/872* (2013.01); *H01L 29/36* (2013.01)

(58) Field of Classification Search
  USPC .......................................................... 257/77
  See application file for complete search history.

(56) References Cited

U.S. PATENT DOCUMENTS

| | | |
|---|---|---|
| 5,216,275 A | 6/1993 | Chen |
| 5,726,469 A | 3/1998 | Chen |
| 6,201,279 B1 | 3/2001 | Pfirsch |
| 6,949,401 B2 | 9/2005 | Kaminski et al. |
| 7,026,650 B2 | 4/2006 | Ryu et al. |
| 7,649,213 B2 | 1/2010 | Hatakeyama et al. |
| 7,772,677 B2 | 8/2010 | Yoshikawa |
| 9,640,609 B2 | 5/2017 | Zhang et al. |
| 2006/0060880 A1 | 3/2006 | Lee et al. |
| 2007/0001230 A1 | 1/2007 | Lee et al. |
| 2007/0215938 A1 | 9/2007 | Yanagida et al. |
| 2007/0272977 A1 | 11/2007 | Saito et al. |
| 2009/0008651 A1 | 1/2009 | Okuno et al. |
| 2009/0101974 A1 | 4/2009 | Saito et al. |
| 2009/0289262 A1 | 11/2009 | Zhang et al. |
| 2010/0133549 A1 | 6/2010 | Zhang et al. |
| 2010/0289032 A1 | 11/2010 | Zhang et al. |
| 2011/0195563 A1 | 8/2011 | Okuno et al. |
| 2011/0215338 A1 | 9/2011 | Zhang |
| 2011/0220913 A1 | 9/2011 | Hatakeyama |
| 2012/0256192 A1 | 10/2012 | Zhang et al. |
| 2013/0140582 A1 | 6/2013 | Kawakami et al. |
| 2014/0061788 A1 | 3/2014 | Chen et al. |
| 2014/0145213 A1 | 5/2014 | Henning et al. |
| 2015/0076515 A1 | 3/2015 | Jung et al. |
| 2016/0087031 A1 | 3/2016 | Ebihara et al. |

FOREIGN PATENT DOCUMENTS

| | | |
|---|---|---|
| JP | 2011-165856 A | 8/2011 |
| JP | 2011-187767 A | 9/2011 |
| JP | 2014-038937 A | 2/2014 |
| WO | 2012/049872 A1 | 4/2012 |
| WO | 2014/208201 A1 | 12/2014 |

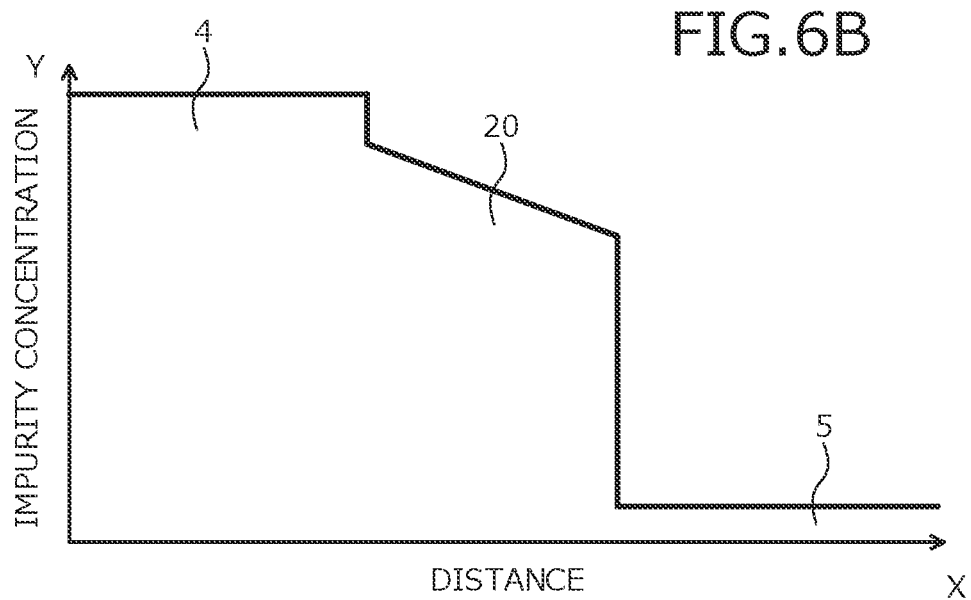
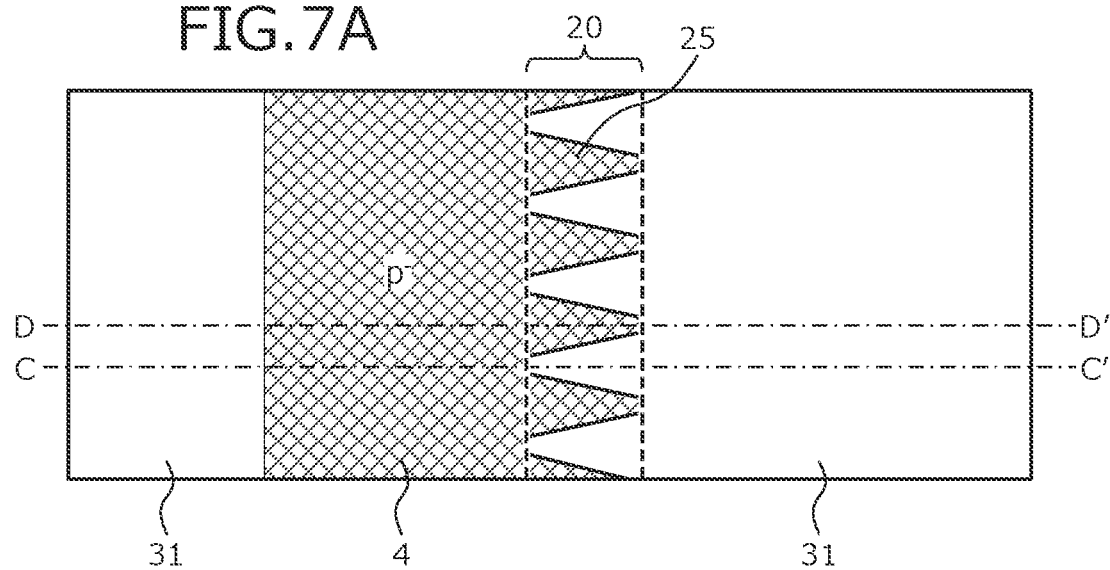

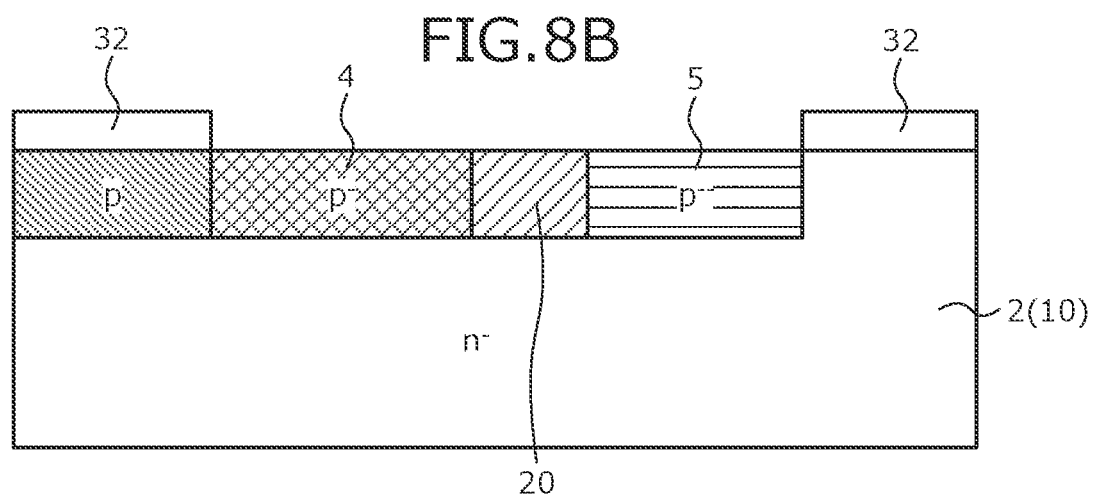

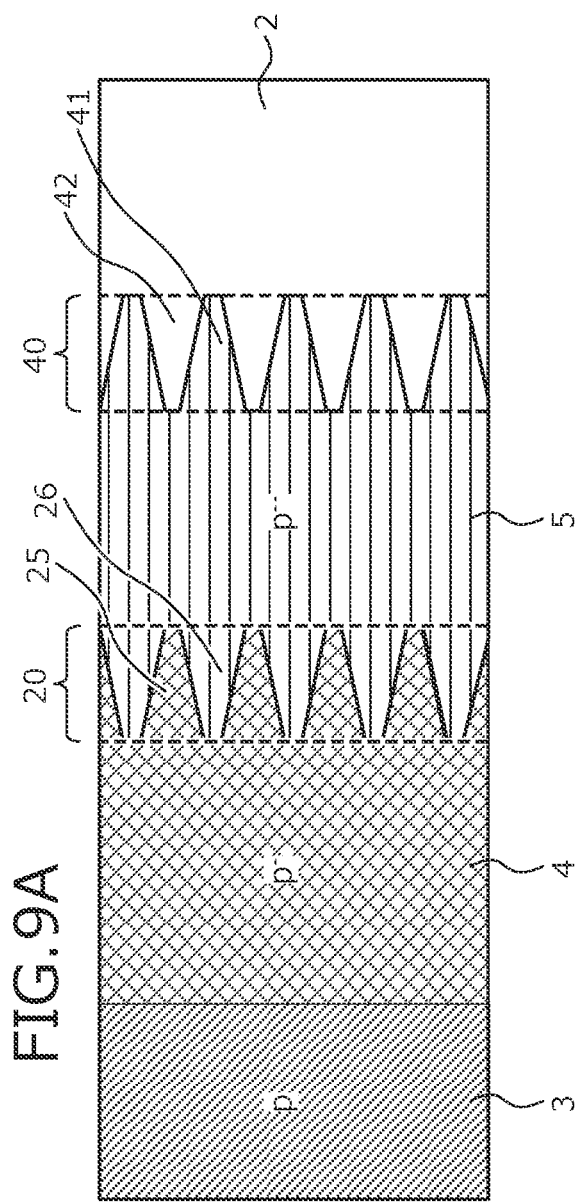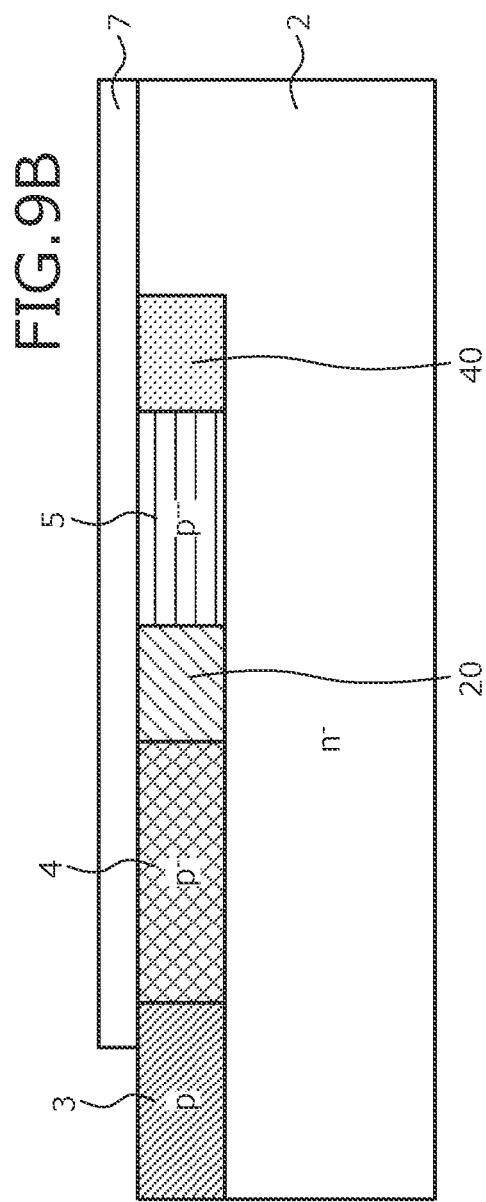

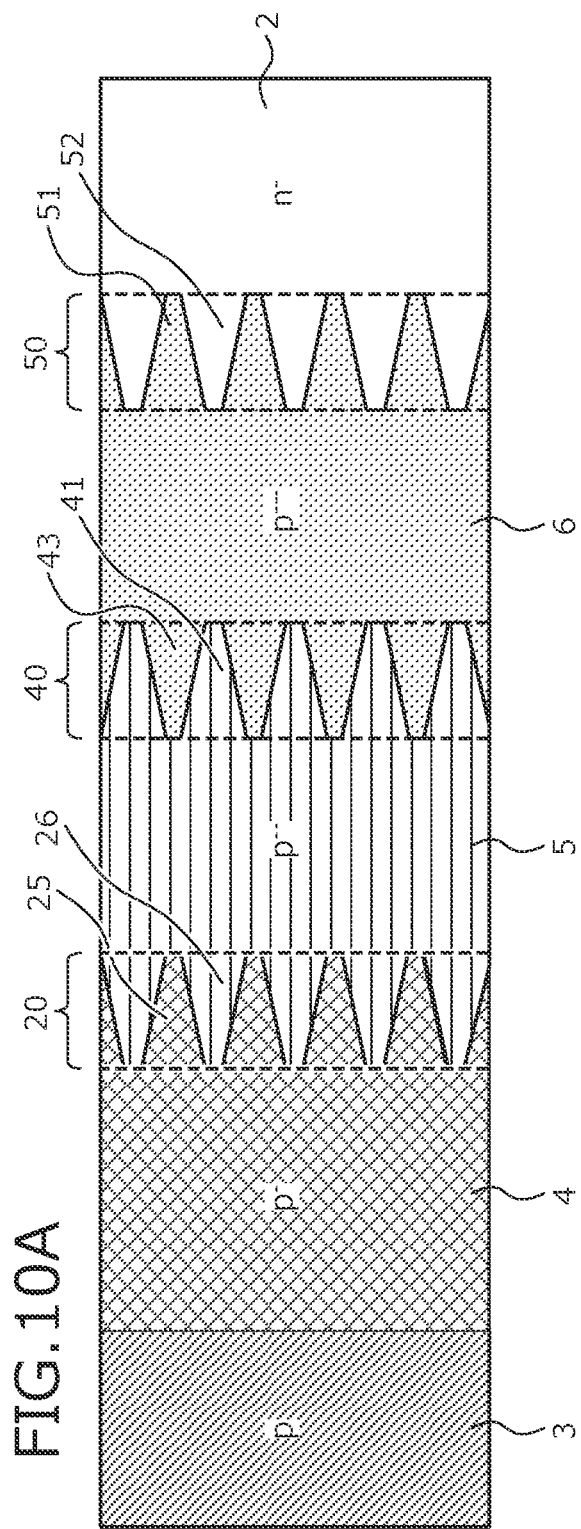
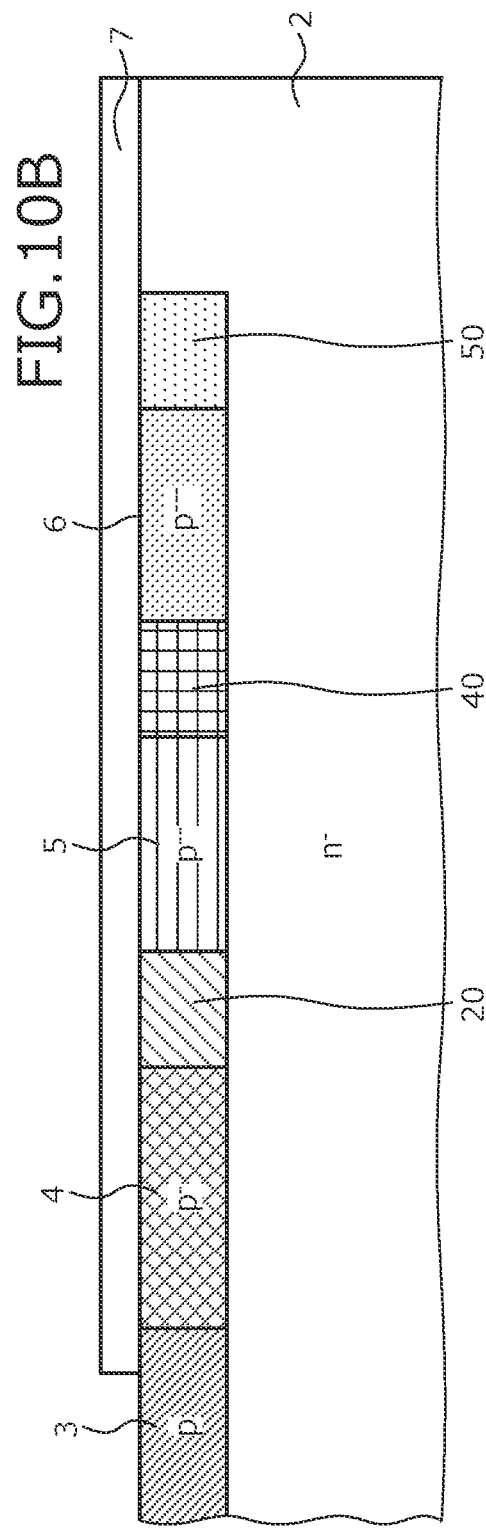

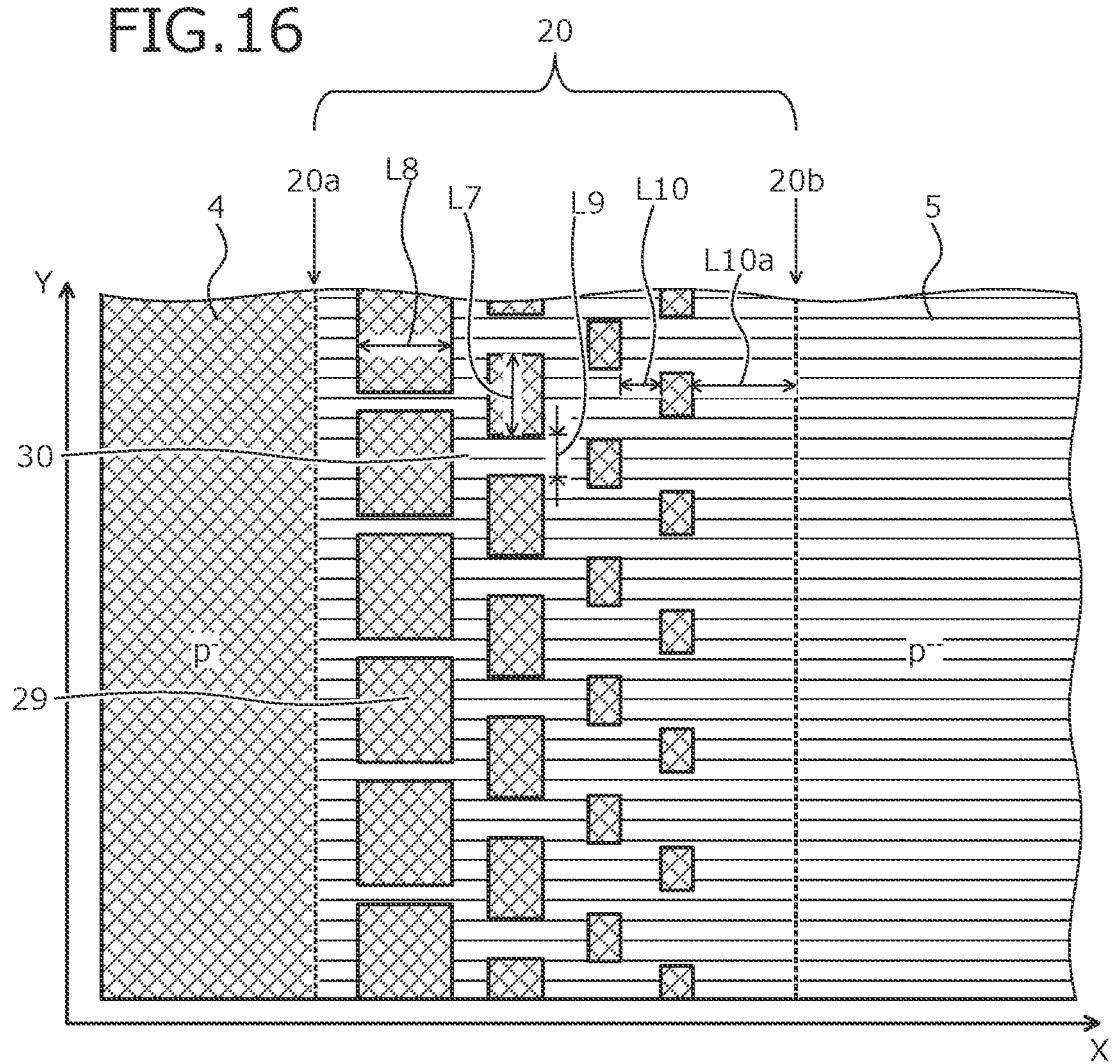

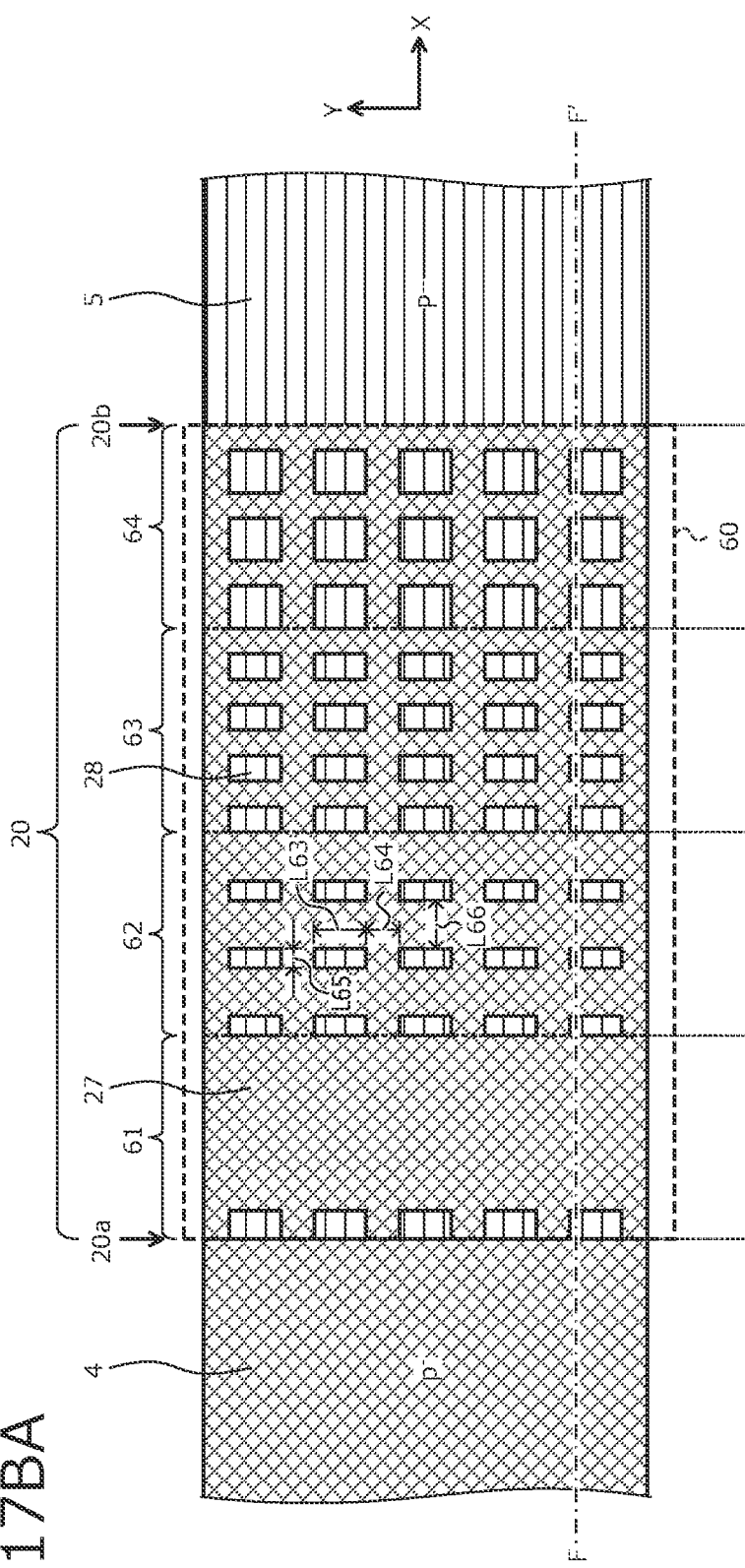

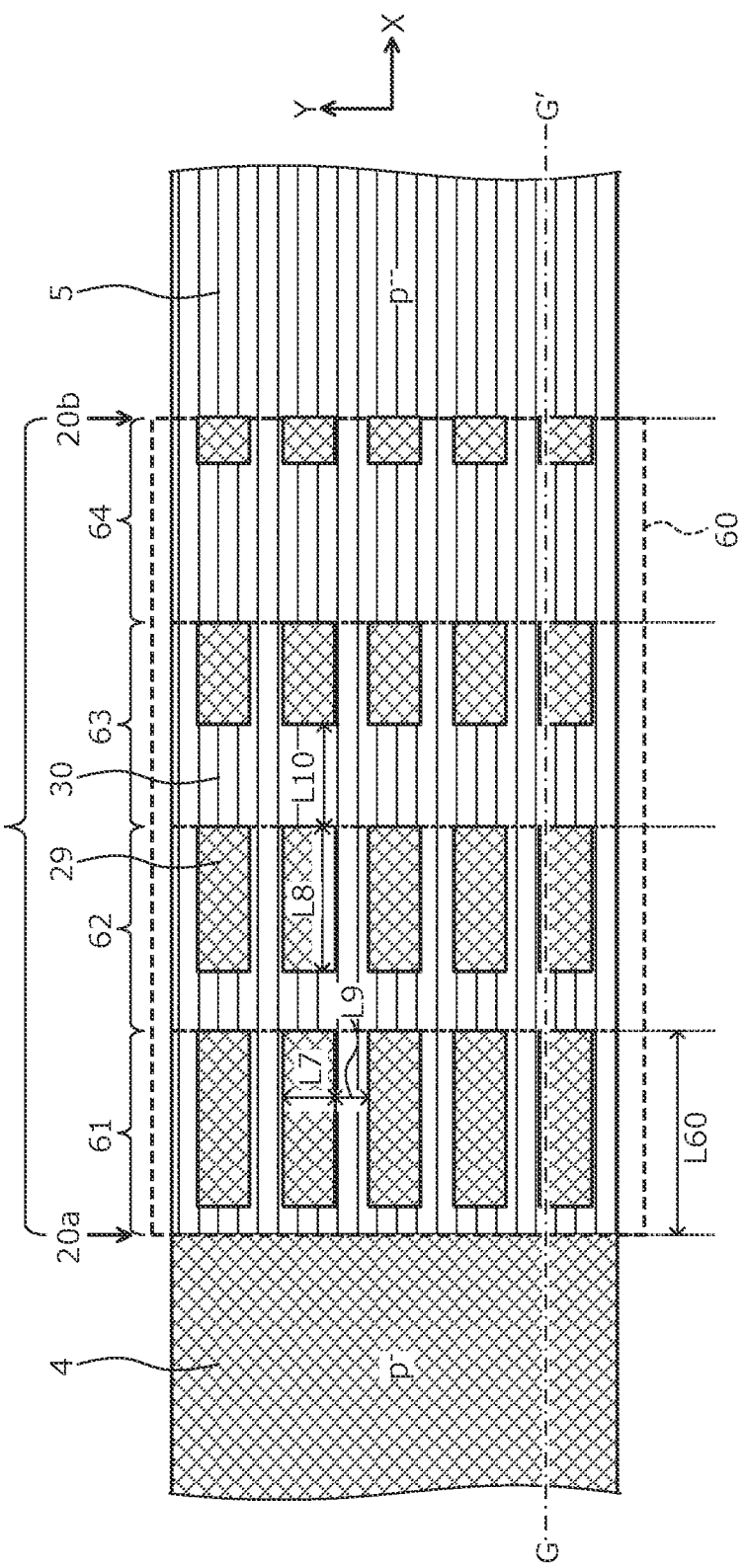
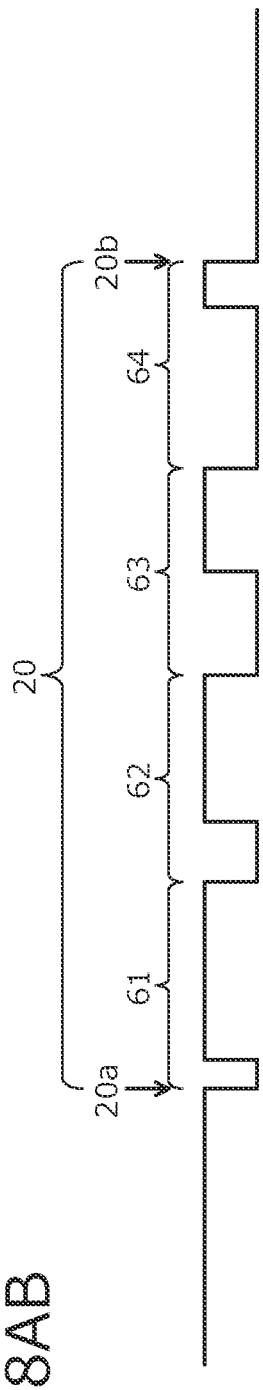
FIG.18AA
FIG.18AB

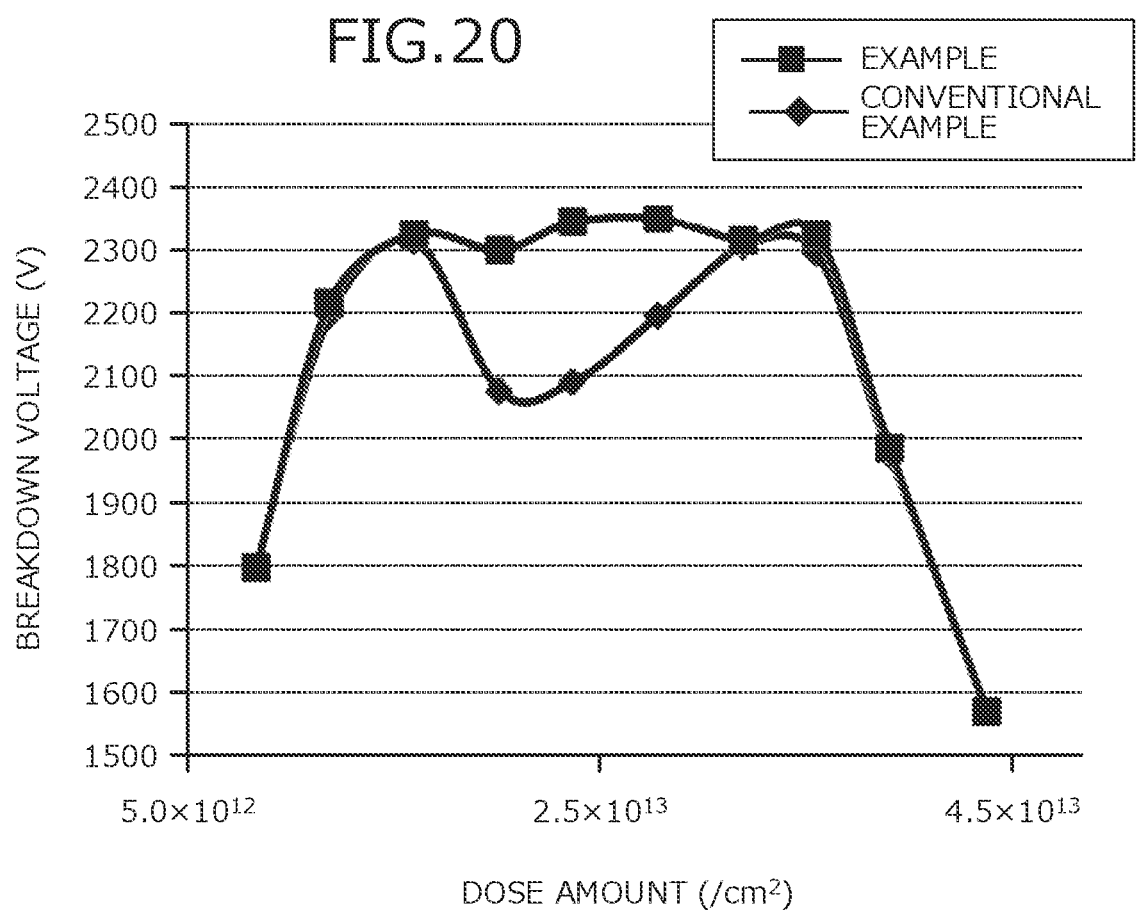

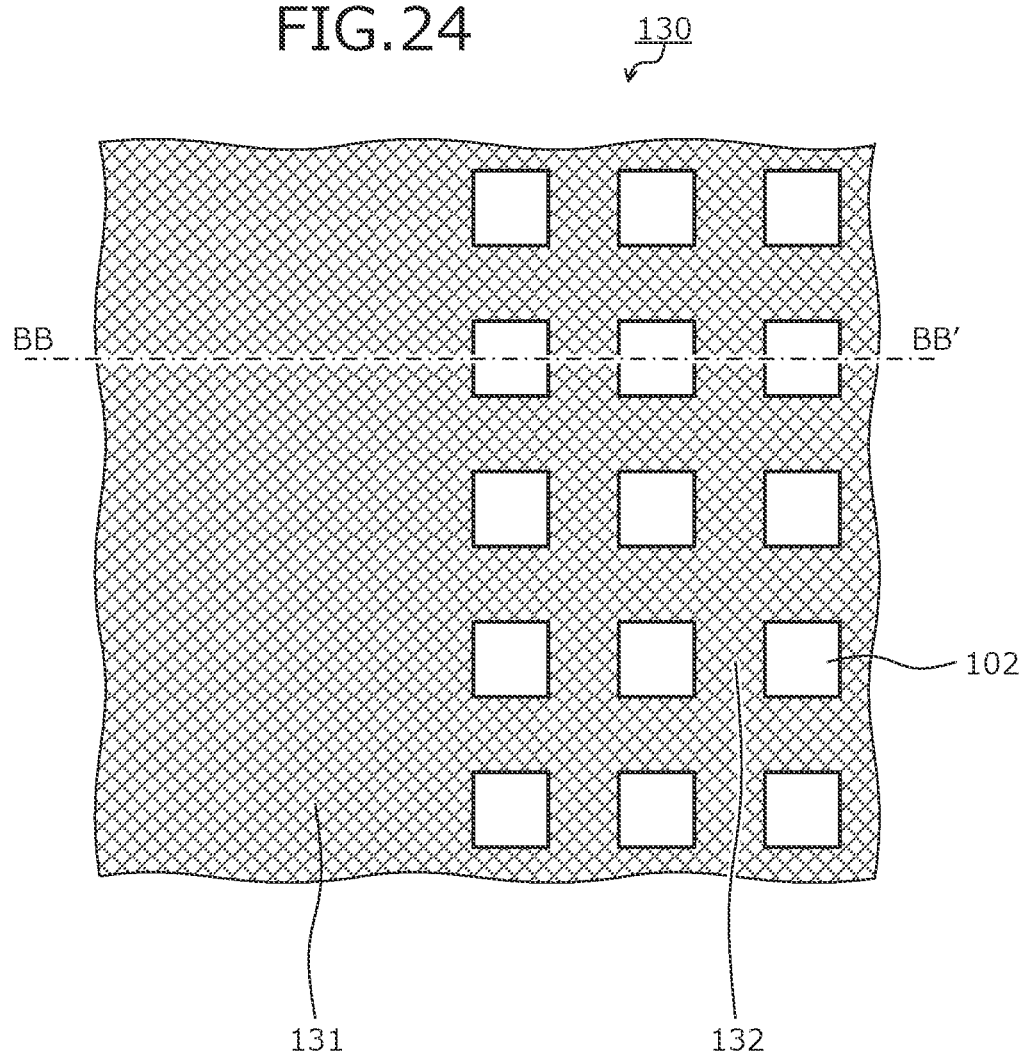

SEMICONDUCTOR DEVICE

CROSS REFERENCE TO RELATED APPLICATIONS

This is a continuation application of co-pending U.S. application Ser. No. 15/250,998 filed on Aug. 30, 2016 and allowed on Aug. 12, 2021, which is a continuation application of International Application PCT/JP2015/076370 filed on Sep. 16, 2015 which claims priority from Japanese Patent Application No. 2014-189477 filed on Sep. 17, 2014, the contents of which are incorporated herein by reference.

BACKGROUND OF THE INVENTION

1. Field of the Invention

The embodiments discussed herein relate to a semiconductor device.

2. Description of the Related Art

Semiconductor devices using a silicon carbide (SiC) semiconductor (hereinafter referred to as a silicon carbide semiconductor device) are recently attracting attention as an element exceeding a limitation of a semiconductor device using a silicon (Si) semiconductor. Particularly, the silicon carbide semiconductor device is expected to be applied to high voltage devices by taking advantage of characteristics of higher critical field strength and higher thermal conductivity as compared to the silicon semiconductor. However, in producing (manufacturing) a practical silicon carbide semiconductor device, it is important to form a termination structure stably providing a high breakdown voltage. A termination structure portion is a region surrounding a periphery of an active region and relaxes electric field on the substrate front surface side of the active region to retain the breakdown voltage. The active region is a region through which current flows in an on-state.

A breakdown voltage of a device is usually limited by electric field concentration on an outer peripheral portion of a p-type high-concentration region that is formed on a front surface side of an n$^-$-type semiconductor substrate (semiconductor chip) serving as an n$^-$-type drift layer and that extends from the active region to near an boundary between the active region and the termination structure portion. For example, in the case of a pn junction diode, this p-type high-concentration region is a p-type anode region forming a pn junction with the n$^-$-type drift layer. Therefore, a junction termination extension (JTE) structure is known in which a p$^-$-type low-concentration region having an impurity concentration lower than that of the p-type high-concentration region is formed adjacent to an outside end portion of the p-type high-concentration region so as to relax the electric field on the termination structure portion.

In the JTE structure, a depletion layer extends from a pn junction between the p-type high-concentration region and the n$^-$-type drift layer to the outside (toward a chip outer peripheral portion) and spreads to both the p-type high-concentration region and the p$^-$-type low-concentration region. As a result, the electric field is relaxed on an outer peripheral portion of the p-type high-concentration region and therefore, the breakdown voltage may be improved. If this JTE structure is applied to an element having a higher breakdown voltage, the electric field concentrates also on an outer peripheral portion of the p$^-$-type low-concentration region and the breakdown voltage is therefore limited by avalanche breakdown in the outer peripheral portion of the p$^-$-type low-concentration region making up the JTE structure and may be prevented by gradually reducing the impurity concentration of the p$^-$-type low-concentration region in the outward direction from the active region side.

The JTE structure made up of the p$^-$-type low-concentration region having an impurity concentration distribution gradually decreasing in the outward direction from the active region side in this way is referred to as a variation of lateral doping (VLD) structure. Since electric field concentration points are distributed to multiple locations in the VLD structure, the critical electric field intensity is significantly reduced. In the case of the silicon carbide semiconductor device having an extremely small thermal diffusion of impurities and subjected to ion implantation with high acceleration voltage for introducing impurities, it is difficult to apply the VLD structure to reduce the impurity concentration of the p$^-$-type low-concentration region in the outward direction from the active region side. Therefore, the JTE structure must be configured by adjacently forming multiple p$^-$-type low-concentration regions such that a region disposed on the outer side has a lower impurity concentration or a thinner thickness.

In the case of configuring the JTE structure made up of multiple p$^-$-type low-concentration regions different in impurity concentration or thickness, it is preferable to increase the number of the p$^-$-type low-concentration regions to make an impurity concentration difference of neighboring p$^-$-type low-concentration regions as small as possible from the viewpoint of breakdown voltage performance of a device. However, this leads to an increase in the number of processes and is, therefore, a factor preventing a reduction in manufacturing cost. Currently, the silicon carbide semiconductor devices are typically provided with a JTE structure made up of multiple p$^-$-type low-concentration regions having impurity concentration or thicknesses changed in two or three stages. A typical JTE structure of the silicon carbide semiconductor devices will be described by taking a Schottky barrier diode (SBD) as an example.

FIGS. 21A and 21B are explanatory views of a conventional SiC-SBD structure. FIG. 21A depicts a planar layout and FIG. 21B depicts a cross-sectional structure taken along a cutting line AA-AA' of FIG. 21A. As shown in FIGS. 21A and 21B, for example, at a breakdown voltage of 600 V or 1200 V, a termination structure portion 112 surrounding a periphery of an active region 111 is typically provided with a JTE structure made up of two p-type regions (a p$^-$-type region 104 and a p$^-$-type region 105) different in impurity concentration. For example, a silicon carbide epitaxial layer serving as an n$^-$-type drift layer 102 is deposited on a front surface of an n$^+$-type silicon carbide substrate 101. An epitaxial substrate made up of the n$^+$-type silicon carbide substrate 101 and the n$^-$-type drift layer 102 will hereinafter be referred to as a silicon carbide base (semiconductor chip).

A surface layer of the front surface (a surface on the n$^-$-type drift layer 102 side) of the silicon carbide base has a p-type guard ring 103 selectively disposed at a boundary between the active region 111 and the termination structure portion 112 from the active region 111 into the termination structure portion 112. The p-type guard ring 103 surrounds a periphery of a Schottky junction between the n$^-$-type drift layer 102 and an anode electrode 106 in the active region 111. In the termination structure portion 112, the surface layer of the front surface of the silicon carbide base has a JTE structure disposed outside the p-type guard ring 103 to surround a periphery of the p-type guard ring 103. The JTE structure is made up of the p$^-$-type region 104 and the p⁻-type region 105 (hereinafter referred to as the first JTE region 104 and the second JTE region 105).

The first JTE region 104 surrounds the periphery of the p-type guard ring 103 and contacts an outside end portion of the p-type guard ring 103. The impurity concentration of the first JTE region 104 is lower than the impurity concentration of the p-type guard ring 103. The second JTE region 105 is disposed outside the first JTE region 104 to surround a periphery of the first JTE region 104 and contacts an outside end portion of the first JTE region 104. The impurity concentration of the second JTE region 105 is lower than the impurity concentration of the first JTE region 104. Both the first and second JTE regions 104, 105 have a uniform impurity concentration distribution. Reference numerals 107, 108 denote an interlayer insulating film and a cathode electrode.

Various proposals have been made on the JTE structure of the silicon carbide semiconductor device so as to relax the electric field of the JTE structure. In a proposed device in which the electric field of the JTE structure is relaxed, multiple p-type subregions having the same impurity concentration as a first JTE region are disposed in a ring shape surrounding the first JTE region in a portion of a second JTE region close to the first JTE region (see, e.g., Japanese Laid-Open Patent Publication No. 2008-034646 (paragraph 0033, FIG. 11)). In another proposed device with the electric field of the JTE structure relaxed, the JTE structure of Japanese Laid-Open Patent Publication No. 2008-034646 is further optimized (see, e.g., International Publication No. 2012/049872). In International Publication No. 2012/049872, a third JTE region surrounding a periphery of the second JTE region is further included, and multiple p-type subregions having the same impurity concentration as the second JTE region are disposed in a portion of the third JTE region close to the second JTE region.

FIGS. 22A and 22B depict a structure obtained by adding the JTE structures of Japanese Laid-Open Patent Publication No. 2008-034646 and International Publication No. 2012/049872 to the JTE structure having the two-layer structure of the first and second JTE regions 104, 105 in FIGS. 21A and 21B. FIGS. 22A and 22B are explanatory views of another example of the conventional SiC-SBD structure. FIG. 22A depicts a planar layout of the JTE structure and FIG. 22B depicts a cross-sectional structure of the JTE structure. In the JTE structure depicted in FIGS. 22A and 22B, an electric field relaxation region 120 made up of p⁻-type subregions 121 and p-type subregions 122 is disposed between the first JTE region 104 and the second JTE region 105. The p⁻-type subregions 122 and p⁻-type subregions 121 are alternately repeatedly arranged in the outward direction from the active region 111 to surround peripheries of p-type subregions adjacent on the inside (the active region side).

The impurity concentration of the p⁻-type subregions 121 is equal to the impurity concentration of the first JTE region 104. The width of each of the p⁻-type subregions 121 (the width in the outward direction from the active region 111) is narrower than the width of the first JTE region 104, and the p⁻-type subregions 121 disposed on the outer side have a smaller width. The impurity concentration of the p⁻-type subregions 122 is equal to the impurity concentration of the second JTE region 105. The width of each of the p⁻-type subregions 122 is narrower than the width of the second JTE region 105, and the p⁻-type subregions 122 disposed on the outer side have a wider width. By progressively changing the widths of the p⁻-type subregions 121 and the p⁻-type subregions 122 outwardly, the impurity concentration is gradually reduced in the direction from the first JTE region 104 to the second JTE region 105 in this configuration.

In Japanese Laid-Open Patent Publication No. 2008-034646 and International Publication No. 2012/049872, the JTE regions are formed in a concentric shape surrounding the periphery of the active region, and the impurity concentration of the JTE regions is controlled by the dose amount of ion implantation. Therefore, to form the JTE structure with the two-layer structure of the first and second JTE regions, photolithography and ion implantation must be each performed at least twice. A device eliminating this problem is proposed as a device including a second JTE region in which a p⁻-type region having the same impurity concentration and the same depth as a first JTE region is disposed in a mesh shape (a lattice shape) with the n⁻-type drift layer left in a matrix shape (see, e.g., Japanese Laid-Open Patent Publication No. 2011-187767). A JTE structure in Japanese Laid-Open Patent Publication No. 2011-187767 is depicted in FIGS. 23A, 23B, and 24.

FIGS. 23A and 23B are plane views of another example of a conventional SiC-SBD structure. FIG. 23A depicts a planar layout and FIG. 23B depicts a cross-sectional structure taken along a cutting line BB-BB' of FIG. 23A. FIG. 24 is an enlarged plane view of a principal part of FIG. 23A. FIG. 24 depicts an enlarged view of a portion surrounded by a rectangular frame 130 of FIG. 23A. As depicted in FIGS. 23A, 23B, and 24, in Japanese Laid-Open Patent Publication No. 2011-187767, the n⁻-type drift layer 102 is selectively left within a second JTE region 132 having the same impurity concentration and the same depth as a first JTE region 131, which is equivalent to disposing a JTE region having an impurity concentration lower than the first JTE region 131 on the outside of the first JTE region 131.

Japanese Laid-Open Patent Publication No. 2011-187767 describes that the n⁻-type drift layer 102 left in a matrix shape may be changed in width and arrangement density to change the proportion of the n⁻-type drift layer 102 occupying the inside of the second JTE region 132 so as to produce a predetermined impurity concentration distribution. The JTE structures described in Japanese Laid-Open Patent Publication No. 2008-034646, International Publication No. 2012/049872, and Japanese Laid-Open Patent Publication No. 2011-187767 are known as improvement items not only for the JTE structure of the silicon carbide semiconductor device but also for the VLD structure described above. For example, an ion implantation using an oxide film having openings in a mesh or matrix shape as a mask is followed by thermal diffusion to form a p⁻-type region in a predetermined pattern, and a predetermined impurity concentration distribution of a JTE region is produced from the pattern shape of this p⁻-type region in a proposed method (see, e.g., Japanese Laid-Open Patent Publication No. 2014-038937 (paragraph 0050, FIG. 3)).

Another proposed method of forming a JTE structure includes a first step of forming an implantation mask made up of multiple unit masks on a silicon carbide semiconductor layer and a second step of implanting predetermined ions with a predetermined implantation energy to the silicon carbide semiconductor layer by using the implantation mask and, at the first step, a distance from an arbitrary point in each unit mask to the end of the unit mask is set within a scattering distance in the case of implanting the predetermined ions to silicon carbide with the predetermined implantation energy, and the implantation mask is formed to have multiple regions with different dimensions and arrangement intervals of the unit masks (see, e.g., Japanese Laid-Open Patent Publication No. 2011-165856). In Japanese Laid-Open Patent Publication No. 2011-165856, the implantation mask formed at the first step is made up of unit masks having a circular shape, a rectangular shape, or a cross shape.

For another method of forming a JTE structure, the following method has been proposed in terms of formation of a JTE structure made up of a first JTE region, a second JTE region disposed outside the first JTE region and having an impurity concentration lower than the first JTE region, and a third JTE region that is made up of first and second p-type subregions different in impurity concentration disposed between the first JTE region and the second JTE region and that has an average impurity concentration between the first JTE region and the second JTE region. Ion implantation is performed by using a first mask to form the same impurity layer as the second JTE region such that the impurity layer reaches a formation region of the first JTE region and to form the second subregions. Subsequently, ion implantation is performed by using a second mask at least covering the second JTE region to form the first JTE region and the first subregions (see, e.g., International Publication No. 2012/049872).

SUMMARY OF THE INVENTION

According to one aspect of the present invention, a semiconductor device includes a semiconductor substrate of a first conductivity type, made of a silicon carbide semiconductor; an active region through which main current flows, disposed on a front surface of the semiconductor substrate; a termination structure portion surrounding a periphery of the active region; a plurality of semiconductor regions of a second conductivity type disposed in a concentric shape surrounding the periphery of the active region, in the termination structure portion such that that the farther out a semiconductor region of the second conductivity type is disposed on the outer side, the lower an impurity concentration thereof is; and an intermediate region of the second conductivity type, disposed between and contacting at least a set of neighboring semiconductor regions of the second conductivity type, the intermediate region of the second conductivity type, having an impurity concentration lower than the semiconductor region of the second conductivity type, adjacent on an inner side and an impurity concentration higher than the semiconductor region of the second conductivity type, adjacent on an outer side. The intermediate region of the second conductivity type is formed by alternately repeatedly arranging first subregions of the second conductivity type and second subregions of the second conductivity type and having an impurity concentration lower than the first subregions in a first direction along a boundary between the active region and the termination structure portion.

In the semiconductor device, the first subregions have a rectangular planar shape having a set of opposite sides defined by a boundary with the semiconductor region of the second conductivity type, adjacent on the inner side and a boundary with the semiconductor region of the second conductivity type, adjacent on the outer side. The second subregions have a rectangular planar shape having a set of opposite sides defined by a boundary with the semiconductor region of the second conductivity type, adjacent on the inner side and a boundary with the semiconductor region of the second conductivity type, adjacent on the outer side.

In the semiconductor device, the first subregions have a convex planar shape that has a width narrowing toward the semiconductor region of the second conductivity type, adjacent on the outer side in a second direction from a boundary with the semiconductor region of the second conductivity type, adjacent on the inner side toward the outside and that is in point contact with the semiconductor region of the second conductivity type, adjacent on the outside. The second subregions are each located between the first subregions neighboring in the first direction and have a trapezoidal planar shape that has a width widening toward the semiconductor region of the second conductivity type, adjacent on the outer side in the second direction.

In the semiconductor device, the first subregions have a trapezoidal planar shape having an upper base defined by a boundary with the semiconductor region of the second conductivity type, adjacent on the inner side and a lower base defined by a boundary with the semiconductor region of the second conductivity type, adjacent on the outer side such that the lower base is narrower than the upper base. The second subregions have a trapezoidal planar shape having an upper base defined by a boundary with the semiconductor region of the second conductivity type, adjacent on the inner side and a lower base defined by a boundary with the semiconductor region of the second conductivity type, adjacent on the outer side such that the lower base is wider than the upper base.

In the semiconductor device, the intermediate region of the second conductivity type is divided in the first direction into a plurality of unit regions to include a set of the first subregion and the second subregion neighboring in the first direction. The first subregion has a width in the first direction made narrower inside the unit region toward the outer side in steps. The second subregion has a width in the first direction made wider inside the unit region toward the outside in steps. A sum of the widths of the first subregion and the second subregion in the first direction is constant from the inner side to the outer side.

In the semiconductor device, the unit region is divided into a plurality of sections in a second direction orthogonal to the first direction. The first subregions disposed in the sections on the outer side have a narrower width in the first direction. The second subregions disposed in the sections on the outer side have a wider width in the first direction. The sections have an average impurity concentration determined by the widths of the first subregion and the second subregion. The average impurity concentration of the sections is reduced at a constant rate toward the outer side.

In the semiconductor device, the first subregions or the second subregions are divided into minute regions of a process limit such that all the sets of the first subregions and the second subregions neighboring in the first direction and arranged inside the sections have the same average impurity concentration.

In the semiconductor device, between the first subregions and the second subregions, regions of a first type are arranged in a matrix-shaped planar layout while regions of a second type are arranged in a mesh-shaped planar layout surrounding the regions of the first type.

In the semiconductor device, the intermediate region of the second conductivity type is divided into a plurality of sections in a second direction orthogonal to the first direction. The sections each include a set of a region of the first type and a region of the second type interposed between the region of the first type and a region of the first type neighboring the region of the first type in the second direction. The sections each have an average impurity concentration determined based on widths of the region of the first type and the region of the second type in the section such that the sections disposed on the outer side have a lower average impurity concentration. A distance between the neighboring regions of the first type is narrowed to a limit of a manufacturing process.

In the semiconductor device, the regions of the first type are the first subregions. The sections disposed on the outer side have the regions of the first type with a narrower width in the second direction and a wider distance in the second direction between the neighboring regions of the first type.

In the semiconductor device, the regions of the first type are the second subregions. The sections disposed on the outer side have the regions of the first type with a wider width in the second direction and a narrower distance in the second direction between the neighboring regions of the first type.

In the semiconductor device, all the adjacent sections have an equal average impurity concentration difference.

In the semiconductor device, when the width and the impurity concentration of the first subregions are $x_1$ and $n_{p1}$, respectively, and the width and the impurity concentration of the second subregions are $x_2$ and $n_{p2}$, respectively, an average impurity concentration Np of each of the sections satisfies Equation (1):

$$Np=((x_1 \times n_{p1})+(x_2 \times n_{p2}))/(x_1+x_2).$$

In the semiconductor device, portions of the regions of the second type interposed between the regions of the first type neighboring in the first direction face the regions of the first type in a third direction orthogonal to a boundary between the active region and the termination structure portion.

In the semiconductor device, the first subregions have the same impurity concentration as the semiconductor region of the second conductivity type, adjacent on the inner side. In the semiconductor device, the second subregions have the same impurity concentration as the semiconductor region of the second conductivity type, adjacent on the outer side.

In the semiconductor device, an average impurity concentration of the intermediate region of the second conductivity type is an intermediate impurity concentration between the semiconductor region of the second conductivity type, adjacent on the inner side and the semiconductor region of the second conductivity type, adjacent on the outer side.

Objects, features, and advantages of the present invention are specifically set forth in or will become apparent from the following detailed description of the invention when read in conjunction with the accompanying drawings.

BRIEF DESCRIPTION OF THE DRAWINGS

FIGS. 6A and 6B are explanatory views of an impurity concentration distribution of a JTE structure of FIGS. 5A and 5B;

FIGS. 7A to 7C, 8A, and 8B are cross-sectional views of a state during manufacturing of a semiconductor device according to a fourth embodiment;

FIGS. 9A and 9B are explanatory views of a structure of a semiconductor device according to a fifth embodiment;

FIGS. 10A and 10B are explanatory views of a structure of a semiconductor device according to a sixth embodiment;

FIGS. 14, 15, and 16 are plane views of further examples of the structure of the semiconductor device according to the tenth embodiment;

FIG. 20 is a characteristic diagram of breakdown voltage characteristics of a termination structure portion of a semiconductor device according to an example;

FIG. 24 is an enlarged plane view of a principal part of FIG. 23A.

DETAILED DESCRIPTION OF THE INVENTION

Figure 1A:
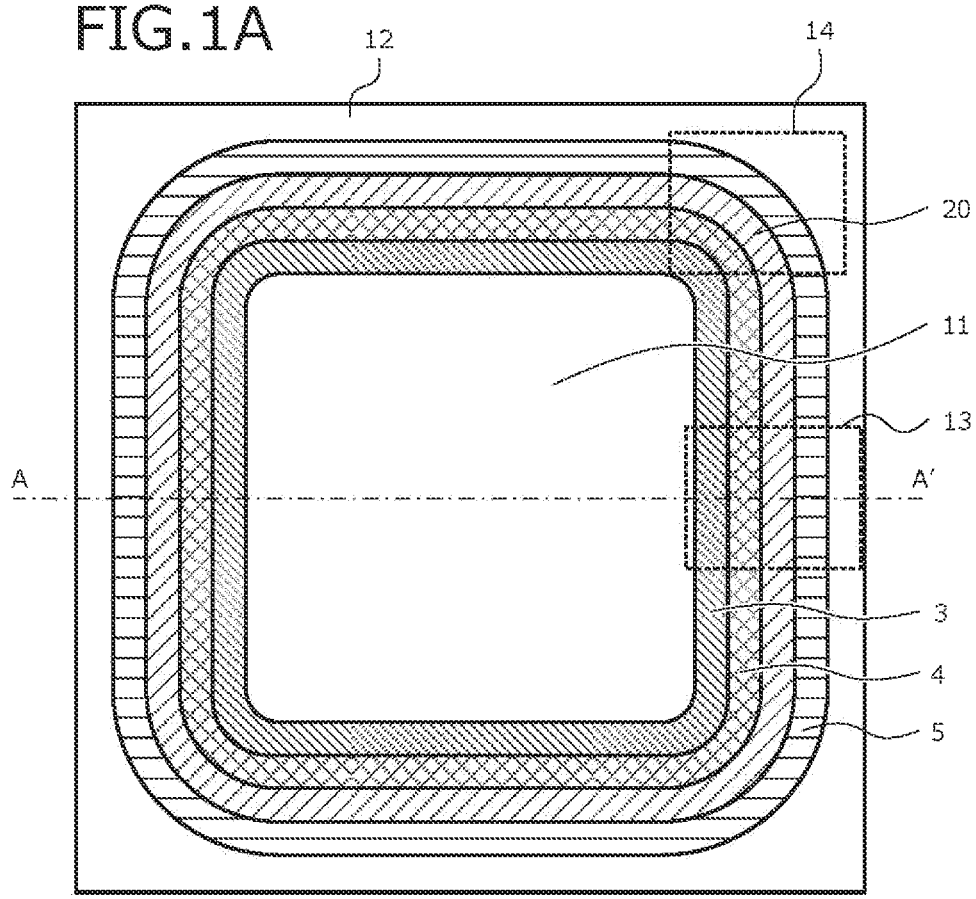
FIGS. 1A and 1B are explanatory views of a structure of a semiconductor device according to a first embodiment.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described.

Figure 1B:
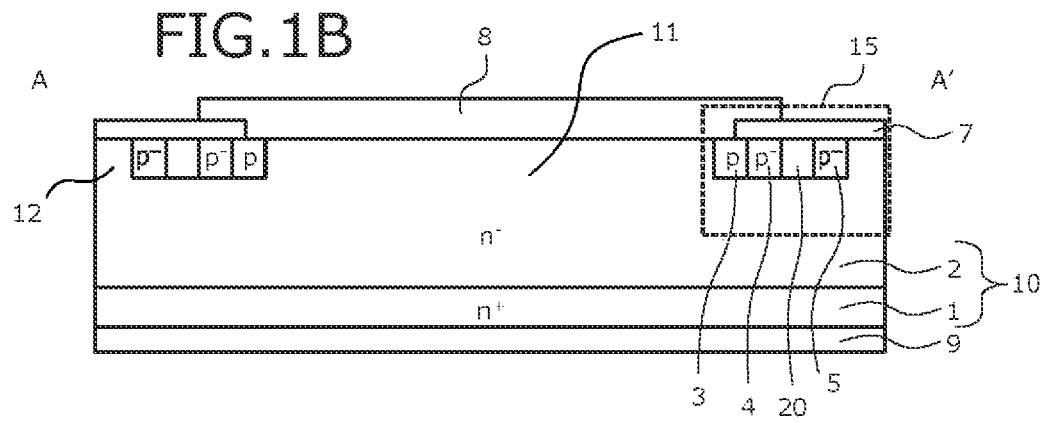
Figure 2A:
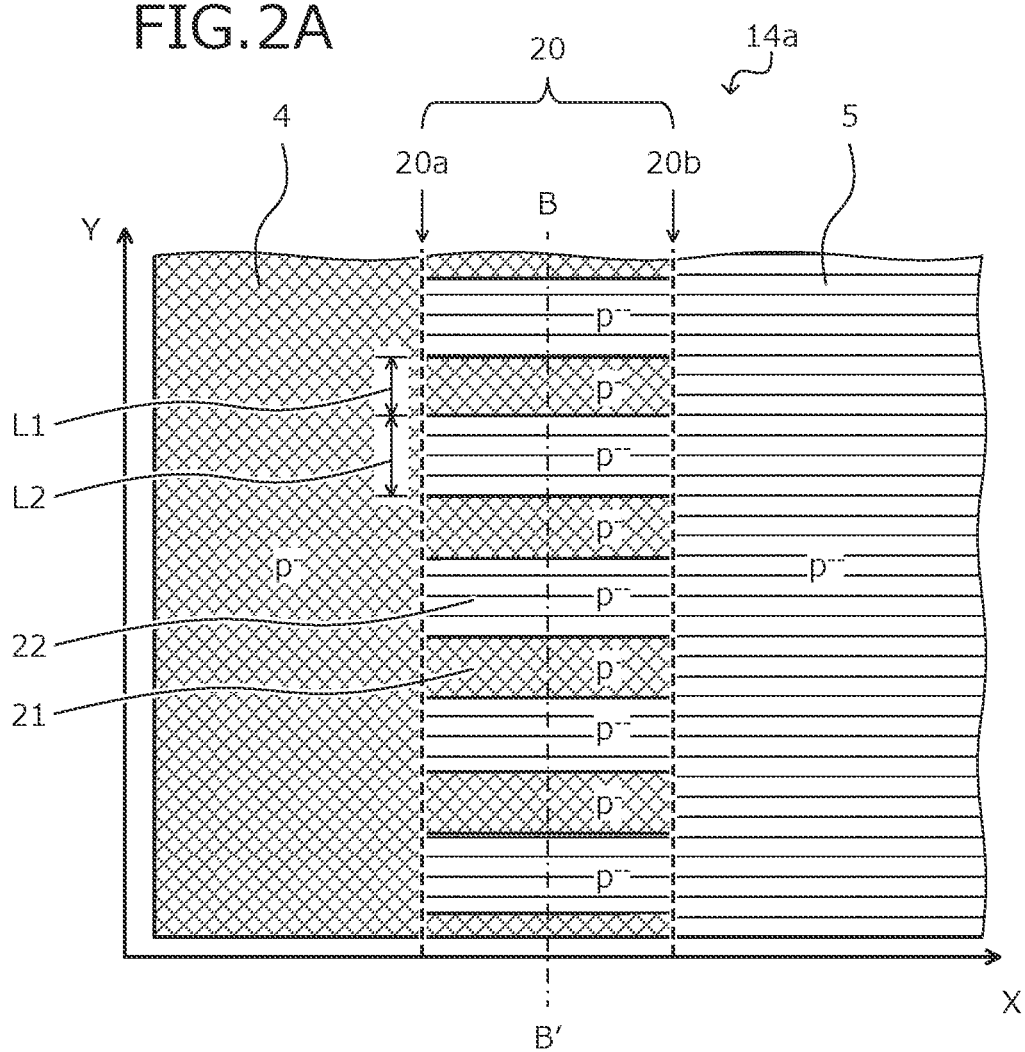
FIGS. 2A, 2B, and 3 are partially enlarged explanatory views of a JTE structure of FIGS. 1A and 1B.
Figure 2B:
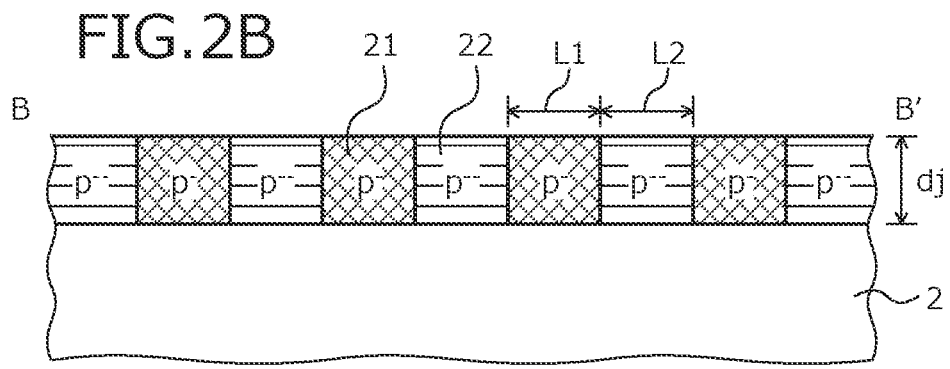
Figure 3:
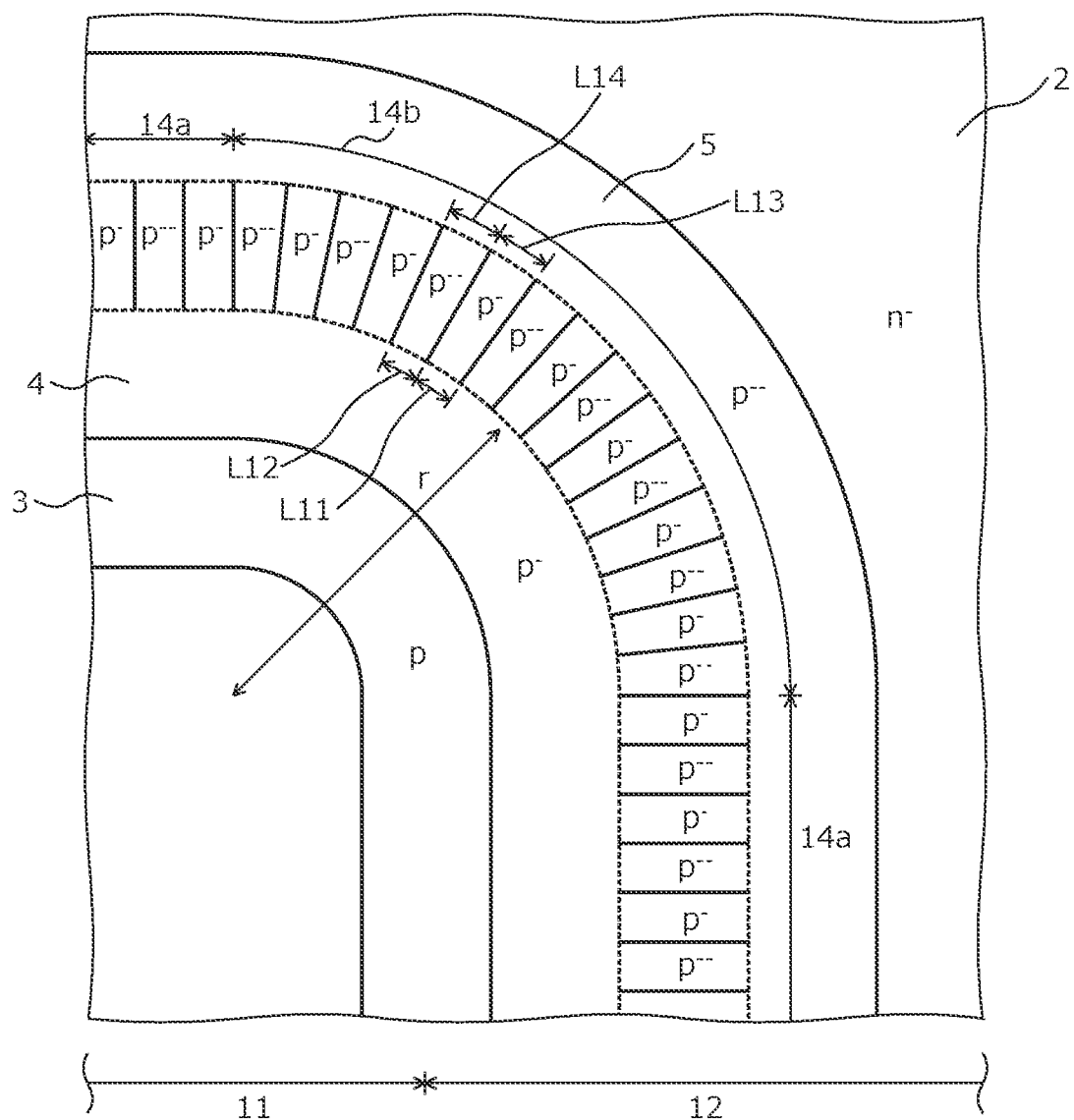

A structure of a semiconductor device according to a first embodiment will be described by taking a Schottky barrier diode (SBD) as an example. FIGS. 1A and 1B are explanatory views of the structure of the semiconductor device according to the first embodiment. FIG. 1A depicts a cross-sectional view of the semiconductor device in parallel to the surface of the drift layer 2, and FIG. 1B depicts a cross-sectional structure of the semiconductor device, taken along a cutting line A-A' of FIG. 1A. FIGS. 2A, 2B, and 3 are partially enlarged explanatory views of a JTE structure of FIGS. 1A and 1B. FIG. 2A depicts an enlarged view of planar layout in a linear portion 14a of the annular JTE structure (a portion surrounded by a rectangular frame 13 of FIG. 1A) and FIG. 2B depicts a cross-sectional structure taken along a cutting line B-B' of FIG. 2A. FIG. 3 depicts an enlarged view of a planar layout in a corner portion 14b of the annular JTE structure (a portion surrounded by a rectangular frame 14 of FIG. 1A).

As shown in FIG. 1A, the semiconductor device according to the first embodiment includes an active region 11 through which current flows in an on-state, and a termination structure portion 12 relaxing an electric field on a base front surface side of the active region 11 to retain a breakdown voltage. The active region 11 is provided with a device structure (not depicted) of the SBD. On a boundary between the active region 11 and the termination structure portion 12, a p-type guard ring 3 is disposed to surround a periphery of the active region 11. The termination structure portion 12 surrounds the periphery of the active region 11. The termination structure portion 12 is provided with a JTE structure made up of two p-type regions (second-conductive type semiconductor regions (a p⁻-type region 4 and a p⁻-type region 5)) different in impurity concentration and a p-type electric field relaxation region (a second-conductive type intermediate region) 20 disposed between the p⁻-type region 4 and the p⁻-type region 5.

The p-type guard ring 3, the p⁻-type region (hereinafter referred to as a first JTE region) 4, the electric field relaxation region 20, and the p⁻-type region (hereinafter referred to as a second JTE region) 5 are arranged in this order from the inside into a concentric shape around the active region 11 (e.g., the center of a semiconductor chip). The p-type guard ring 3, the first JTE region 4, the electric field relaxation region 20, and the second JTE region 5 each have a rectangular planar shape made up of, for example, four linear portions 14a and corner portions 14b coupling the neighboring linear portions 14a to each other. The impurity concentration of the first JTE region 4 is lower than the impurity concentration of the p-type guard ring 3. The impurity concentration of the second JTE region 5 is lower than the impurity concentration of the first JTE region 4 and the average impurity concentration of the electric field relaxation region 20.

The first and second JTE regions 4, 5 may have uniform impurity concentration in both a horizontal direction (lateral direction) and an orthogonal direction (depth direction) relative to a base principal surface or may have respective predetermined impurity concentration distributions. The average impurity concentration of the electric field relaxation region 20 is higher than the impurity concentration of the first JTE region 4 and lower than the impurity concentration of the second JTE region 5. Additionally, the average impurity concentration of the electric field relaxation region 20 is preferably an intermediate impurity concentration between the first JTE region 4 and the second JTE region 5. The electric field relaxation region 20 will be described in detail later. As described above, the p-type guard ring 3, the first JTE region 4, the electric field relaxation region 20, and the second JTE region 5 arranged in the termination structure portion 12 have an impurity concentration made lower in the regions disposed on the outer side (the chip outer peripheral portion side).

As depicted in FIG. 1B, the p-type guard ring 3, the first JTE region 4, the electric field relaxation region 20, and the second JTE region 5 are each selectively disposed in a surface layer of a front surface (a surface on an n⁻-type drift layer 2 side) of a silicon carbide base (semiconductor chip) 10. The silicon carbide base 10 is an epitaxial substrate formed by stacking a silicon carbide epitaxial layer serving as the n⁻-type drift layer 2 on a front surface of an n⁺-type silicon carbide substrate 1. The p-type guard ring 3 is selectively disposed at a boundary between the active region 11 and the termination structure portion 12 from the active region 11 into the termination structure portion 12. The p-type guard ring 3 surrounds a periphery of a Schottky junction between the n⁻-type drift layer 2 and an anode electrode 8 in the active region 11.

The JTE structure is disposed outside the p-type guard ring 3. For example, among the regions making up the JTE structure, the first JTE region 4 is disposed innermost (closest to the active region) and contacts the outside end portion of the p-type guard ring 3. The electric field relaxation region 20 is disposed outside the first JTE region 4 and contacts the outside end portion of the first JTE region 4. The second JTE region 5 is disposed outside the electric field relaxation region 20 and contacts the outside end portion of the electric field relaxation region 20. The depths of the p-type guard ring 3, the first JTE region 4, the electric field relaxation region 20, and the second JTE region 5 may be equal to each other or may variously be adjusted to satisfy the impurity concentration difference with the adjacent regions.

An interlayer insulating film 7 covers the JTE structure of the termination structure portion 12 (i.e., the first JTE region 4, the electric field relaxation region 20, and the second JTE region 5). Therefore, the JTE structure of the termination structure portion 12 is electrically insulated from the anode electrode 8 by the interlayer insulating film 7. The inside end portion of the interlayer insulating film 7 extends onto the p-type guard ring 3. The anode electrode 8 is disposed on the front surface of the silicon carbide base 10 and forms a Schottky junction with the n⁻-type drift layer 2 and contacts the p-type guard ring 3. The end portion of the anode electrode 8 extends onto the interlayer insulating film 7. A cathode electrode 9 is disposed on a back surface of the silicon carbide base 10 (a back surface of the n⁺-type silicon carbide substrate 1 serving as an n⁺-type cathode layer).

The electric field relaxation region 20 will be described in detail. As depicted in FIG. 2, the electric field relaxation region 20 is formed by alternately repeatedly arranging p⁻-type regions (hereinafter referred to as first subregions) 21 and p⁻-type regions (hereinafter referred to as second subregions) 22 in a tangential direction (hereinafter simply referred to as a tangential direction (first direction)) Y of the outer periphery of the active region 11 (i.e., the boundary between the active region 11 and the termination structure portion 12). Therefore, the electric field relaxation region 20 forms a super junction (SJ) structure having the first subregions 21 and the second subregions 22 alternately repeatedly arranged as a parallel pn layer. Thus, the first subregions 21 and the second subregions 22 are preferably charge-balanced.

Both the first and second subregions 21, 22 have a rectangular planar shape having opposite sides defined by a boundary 20a with the first JTE region 4 and a boundary 20b with the second JTE region 5. Both the first and second subregions 21, 22 contact the first JTE region 4 and the second JTE region 5. Therefore, the first subregions 21 and the second subregions 22 are arranged in a stripe-shaped planar layout extending in a normal direction (hereinafter simply referred to as a normal direction (second direction or third direction)) X of the outer periphery of the active region 11. The impurity concentration of the first subregions 21 is substantially equal to the impurity concentration of the first JTE region 4. The impurity concentration of the second subregions 22 is substantially equal to the impurity concentration of the second JTE region 5.

Therefore, the JTE structure is configured in a planar layout in which the first JTE region 4 and the first subregions 21 having the substantially equal impurity concentration and the second JTE region 5 and the second subregions 22 having the substantially equal impurity concentration are arranged in a comb tooth shape. The first and second subregions 21, 22 may have uniform impurity concentration in both the lateral direction and the depth direction or may have respective predetermined impurity concentration distributions. In FIGS. 2A, 2B, and 3, dotted lines indicate the boundary 20a between the first JTE region 4 and the electric field relaxation region 20 as well as the boundary 20b between the second JTE region 5 and the electric field relaxation region 20 (similarly for FIGS. 4 to 16). In FIG. 2, the same hatching indicates the regions having a substantially equal impurity concentration (the first JTE region 4 and the first subregions 21 as well as the second JTE region 5 and the second subregions 22) (the same applies to JTE regions and subregions of FIGS. 4 to 16).

In the linear portions 14a of the JTE structure, for example, the first and second subregions 21, 22 have substantially the same widths L1, L2 in the tangential direction Y and are arranged at substantially the same pitches in the tangential direction Y. The widths L1, L2 in the tangential direction Y of the first and second subregions 21, 22 are set to a dimension such that when a predetermined reverse voltage is applied, the first and second subregions 21, 22 are depleted by a depletion layer extending outward from a pn junction between the p-type guard ring 3 and the n$^-$-type drift layer 2 before reaching the dielectric breakdown voltage of the termination structure portion 12. For example, as described later, the first and second subregions 21, 22 are formed by photolithography and ion implantation for forming the first JTE region 4 (or the second JTE region 5) (see a fourth embodiment). Therefore, the widths L1, L2 in the tangential direction Y of the first and second subregions 21, 22 are determined based on a ratio of dose amounts of the ion implantations for forming the first and second subregions 21, 22.

For example, the widths L1, L2 in the tangential direction Y of the first and second subregions 21, 22 may be determined as follows. Since a diffusion coefficient of p-type impurities for the silicon carbide semiconductor is substantially negligibly small, it is assumed that the first and second subregions 21, 22 have substantially equal diffusion depths dj. For example, in a typical manufacturing process of a silicon carbide semiconductor device, the regions making up the JTE structure are formed by multiple ion implantations (multistage ion implantation) with high acceleration voltage and thermal diffusion treatment. Therefore, as depicted in FIG. 2B, the cross-sectional shapes of the first and second subregions 21, 22 in the cross sections in the tangential direction Y have a box shape (substantially square shape) with the diffusion depths dj of about 0.6 μm, for example.

The widths L1, L2 in the tangential direction Y of the first and second subregions 21, 22 are determined by achieving a charge balance between the first subregions 21 and the second subregions 22. For example, if the impurity concentration ratio between the first subregions 21 and the second subregions 22 is 1:0.6, the ratio between the width L1 of the first subregions 21 and the width L2 of the second subregions 22 in the tangential direction Y is 0.6:1. Therefore, lowest values of the widths L1, L2 in the tangential direction Y of the first and second subregions 21, 22 are 1.5 μm and 2.5 μm, respectively, for example. Lower limit values of the widths L1, L2 in the tangential direction Y of the first and second subregions 21, 22 are determined depending on the dimension accuracy of photolithography and are therefore equal to or greater than a smallest width of an opening portion of an ion implantation mask.

As depicted in FIG. 3, in the corner portions 14b of the JTE structure, the first and second subregions 21, 22 have, for example, a substantially trapezoidal planar shape having the bases defined by the boundaries 20a, 20b with the first and second JTE regions 4, 5 and the legs defined by boundaries of the first and second subregions 21, 22 with each other in the normal direction X from the center of a circular arc shape of the corner portions 14b having a curvature radius r. In particular, the first and second subregions 21, 22 in the corner portions 14b have the upper bases defined by the boundary 20a with the first JTE region 4 and the lower bases defined by the boundary 20b with the second JTE region 5 and have wider widths (lower bases) L13, L14 in the tangential direction Y on the outside (the second JTE region 5 side) as compared to widths (upper bases) L11, L12 in the tangential direction Y on the inside (the first JTE region 4 side). The first and second subregions 21, 22 in the corner portions 14b may have the widths L11, L12 in the tangential direction Y on the inside substantially equal to the widths L1, L2, respectively, in the tangential direction Y of the first and second subregions 21, 22 in the linear portions 14a, for example.

As is the case with the linear portions 14a, the dimensions of the first and second subregions 21, 22 are determined in the corner portions 14b of the JTE structure such that the first subregions 21 and the second subregions 22 are charge-balanced. Therefore, the dimensions of the first and second subregions 21, 22 may be set based on the impurity concentration ratio between the first and second subregions 21, 22 in the corner portions 14b of the JTE structure as is the case with the linear portions 14a. Although the corner portions 14b of the JTE structure has a more concentrated electric field than the linear portions 14a (the electric field is particularly concentrated on the second subregion 22 side), the electric field may be relaxed by making the repetition pitches of the first and second subregions 21, 22 narrower. The curvature radius r of the corner portions 14b must be made larger as compared to the conventional JTE structures without the electric field relaxation region 20 and is preferably 150 μm or more, for example.

As described above, the electric field relaxation region 20 is a p$^-$-type region in which the first and second subregions 21, 22 having substantially the same dimensions and substantially the same impurity concentration are arranged substantially evenly. Therefore, the average impurity concentration of the electric field relaxation region 20 is an intermediate impurity concentration between the impurity concentration of the first JTE region 4 and the impurity concentration of the second JTE region 5. When a reverse voltage is applied, depletion sequentially proceeds in the normal direction X as the reverse voltage rises, and the first JTE region 4, the electric field relaxation region 20, and the second JTE region 5 are depleted in this order. In this case, since the difference of the impurity concentration of the first JTE region 4 and the average impurity concentration of the electric field relaxation region 20 is smaller than the impurity concentration difference of the first and second JTE regions of the conventional JTE structures without the electric field relaxation region 20, the electric field concentration between the first JTE region 4 and the second JTE region 5 is relaxed as compared to the conventional JTE structures without the electric field relaxation region 20.

As described above, according to the first embodiment, by disposing between the first JTE region and the second JTE region, the electric field relaxation region formed by alternately repeatedly arranging the first and second subregions respectively having substantially the same impurity concentrations as the first and second JTE regions in the tangential direction, the impurity concentration gradient between the first JTE region and the second JTE region may be made smaller as compared to the case without the electric field relaxation region. As a result, the electric field between the first JTE region and the second JTE region may be relaxed, and the dielectric breakdown strength may be made higher in the outer peripheral portion of the termination structure portion. Therefore, the breakdown voltage of the termination structure portion may be improved.

Figure 4:
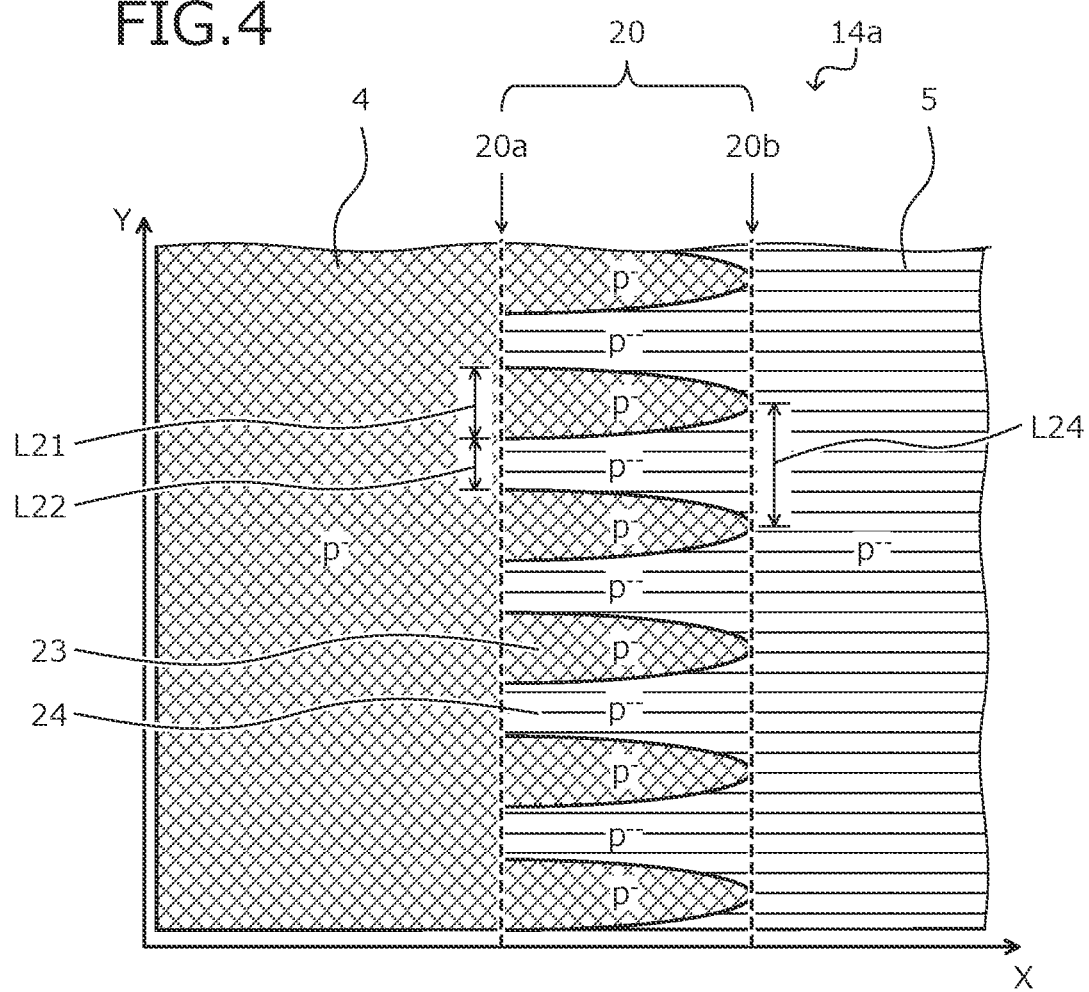
FIG. 4 is a plane view of a structure of a semiconductor device according to a second embodiment.

A structure of a semiconductor device according to a second embodiment will be described. FIG. 4 is a plane view of the structure of the semiconductor device according to the second embodiment. FIG. 4 depicts an enlarged view of a planar layout in the linear portion of the JTE structure of FIG. 1A (the portion surrounded by the rectangular frame 13). The semiconductor device according to the second embodiment is different from the semiconductor device according to the first embodiment in that first and second subregions 23, 24 are disposed in planar shapes forming curved boundaries between the first subregions 23 and the second subregions 24.

For example, the first subregions 23 are each in a convex (in FIG. 4, circular arc) planar shape that has a width L21 in the tangential direction Y narrowing from the boundary 20a with the first JTE region 4 toward the second JTE region 5 in the normal direction X toward the outside and that is in point contact with the second JTE region 5. The second subregions 24 are located between the first subregions 23 neighboring in the tangential direction Y and are each in a planar shape that has a width L22 in the tangential direction Y widening into a width L24 (L24>L21) toward the second JTE region 5 in the normal direction X (in FIG. 4, a substantially trapezoidal planar shape having a circular arc portion). Therefore, the sum of the width L21 in the tangential direction Y on the inside of the first subregion 23 and the width L22 in the tangential direction Y on the inside of the second subregion 24 is substantially equal to the width L24 in the tangential direction Y on the outside of the second subregion 24.

Therefore, the first subregions 23 have an impurity concentration distribution decreasing from the active region 11 side in the outward direction at a rate corresponding to the curvature of the boundaries between the first subregions 23 and the second subregions 24. On the other hand, the second subregions 24 have an impurity concentration distribution increasing from the active region 11 side in the outward direction such that charge balance is achieved with the first subregions 23. The first subregions 23 and the second JTE region 5 are substantially in linear contact. Therefore, the average impurity concentration on the second JTE region 5 side of the electric field relaxation region 20 is substantially equal to the impurity concentration of the second JTE region 5, and the electric field is relaxed at the boundary 20b between the second JTE region 5 and the electric field relaxation region 20.

As described above, according to the second embodiment, the same effect as the first embodiment may be produced. According to the second embodiment, the planar shapes of the first and second subregions can variously be changed to control the impurity concentration gradient between the first JTE region and the second JTE region.

Figure 5A:
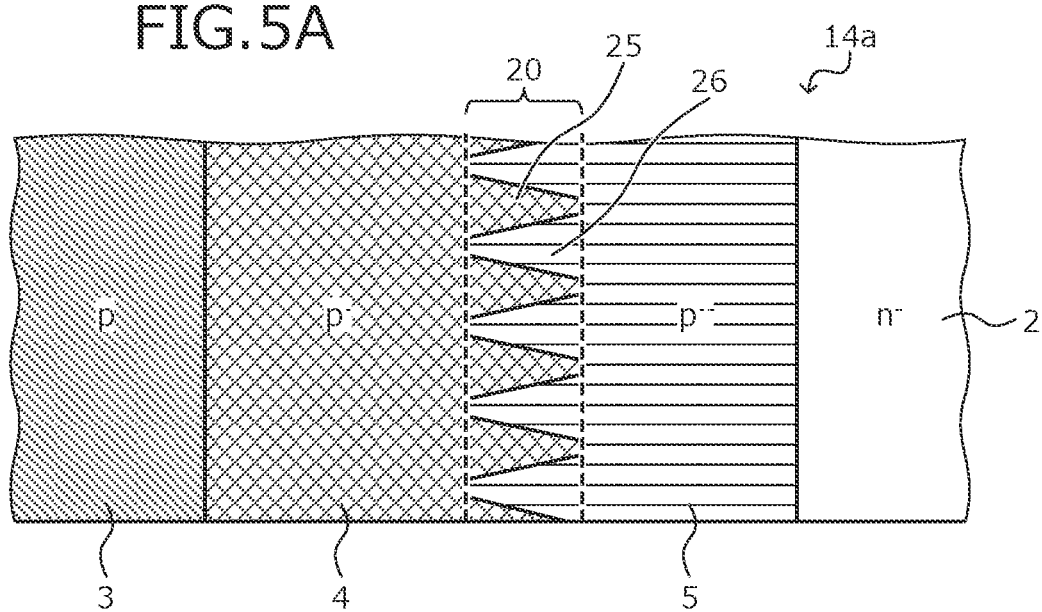
FIGS. 5A and 5B are explanatory views of a structure of a semiconductor device according to a third embodiment.
Figure 5B:
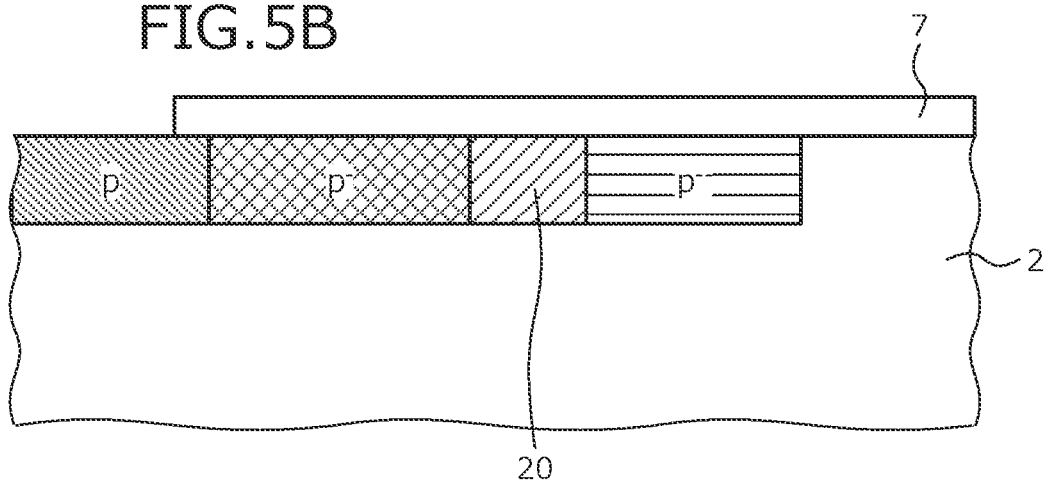
Figure 6A:
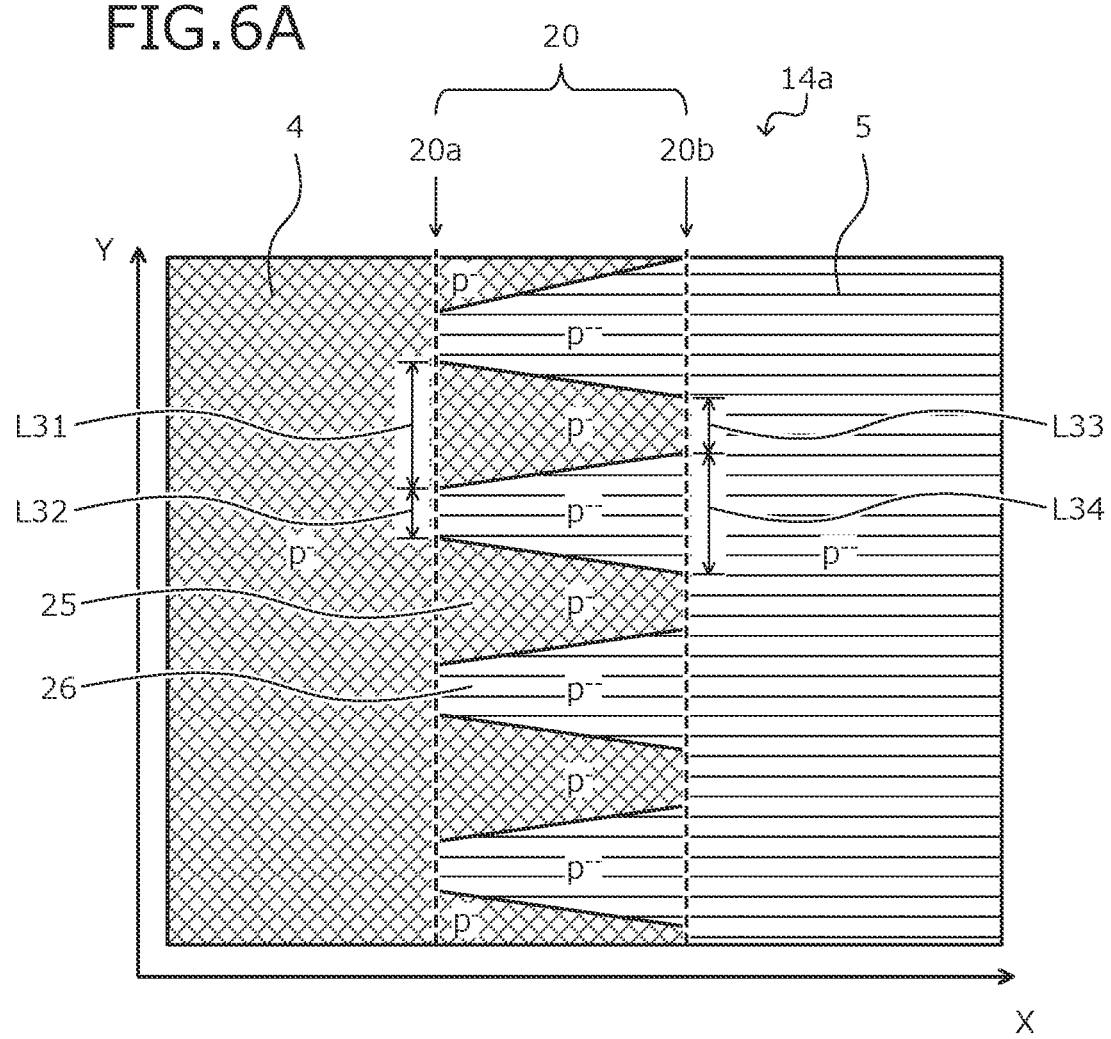

A structure of a semiconductor device according to a third embodiment will be described. FIGS. 5A and 5B are explanatory views of the structure of the semiconductor device according to the third embodiment. FIGS. 6A and 6B are explanatory views of an impurity concentration distribution of a JTE structure of FIGS. 5A and 5B. FIGS. 5A and 6A depict an enlarged view of a planar layout in the linear portion 14a of the JTE structure of FIG. 1A (the portion surrounded by the rectangular frame 13) and FIG. 5B depicts an enlarged view of a cross-sectional structure of the JTE structure (a portion surrounded by a rectangular frame 15 of FIG. 1B). FIG. 6B depicts an impurity concentration distribution of the JTE structure of FIG. 6A. The semiconductor device according to the third embodiment is different from the semiconductor device according to the first embodiment in that first and second subregions 25, 26 are disposed in such a manner as to reduce the average impurity concentration distribution of the electric field relaxation region 20 at a constant rate from the active region 11 side in the outward direction.

For example, as depicted in FIGS. 5A and 6A, the first subregions 25 have a substantially trapezoidal planar shape having the upper base defined by the boundary 20a with the first JTE region 4 and the lower base defined by the boundary 20b with the second JTE region 5 such that a width (lower base) L33 in the tangential direction Y on the outside (the second JTE region 5 side) is made narrower than a width (upper base) L31 in the tangential direction Y on the inside (the first JTE region 4 side). The second subregions 26 have a substantially trapezoidal planar shape having the upper base defined by the boundary 20a with the first JTE region 4 and the lower base defined by the boundary 20b with the second JTE region 5 such that a width (lower base) L34 in the tangential direction Y on the outside is made wider than a width (upper base) L32 in the tangential direction Y on the inside. Although not depicted, the planar shapes of the first and second subregions 25, 26 in the corner portions 14b are substantially trapezoidal shapes based on the curvature of the circular arc shape of the corner portions 14b as is the case with the first embodiment. The dimensions of the first and second subregions 25, 26 may be determined such that the first subregions 25 and the second subregions 26 are charge-balanced as is the case with the first embodiment.

By arranging the first and second subregions 25, 26 in the planar shapes as described above, the average impurity concentration of the electric field relaxation region 20 is set to a value closer to the impurity concentration of the first JTE region 4 in a portion on the first JTE region 4 side and is set to a value closer to the impurity concentration of the second JTE region 5 in a portion on the second JTE region 5 side. As depicted in FIG. 6B, the average impurity concentration distribution of the electric field relaxation region 20 is a distribution decreasing at a constant rate from the active region 11 side in the outward direction. Therefore, the electric field may be relaxed at the boundary 20a between the first JTE region 4 and the electric field relaxation region 20 as well as the boundary 20b between the second JTE region 5 and the electric field relaxation region 20.

The average impurity concentration distribution of the electric field relaxation region 20 is preferably made more gradual. The reason is that because the impurity concentration can be reduced gradually by a smaller impurity concentration difference from the active region 11 side in the outward direction, the electric field in the electric field relaxation region 20 may be more relaxed. On the other hand, as the average impurity concentration distribution of the electric field relaxation region 20 is made more gradual, the width in the normal direction X of the electric field relaxation region 20 becomes wider, preventing a reduction in size. Therefore, preferably, the gradient of the average impurity concentration distribution of the electric field relaxation region 20 is made gradual to the extent possible within an allowable dimension range.

The semiconductor device may be configured such that the electric field is relaxed in the inside portion of the termination structure portion 12 having a more concentrated concentrating electric field. The electric field is more concentrated at the boundary 20a between the first JTE region 4 and the electric field relaxation region 20 than the boundary 20b between the second JTE region 5 and the electric field relaxation region 20 located on the outside. Therefore, the gradient of the average impurity concentration distribution of the electric field relaxation region 20 may be set such that the impurity concentration difference with the first JTE region 4 becomes smaller than the impurity concentration difference with the second JTE region 5.

As described above, according to the third embodiment, the same effect as the first and second embodiments may be produced.

Figure 7B:
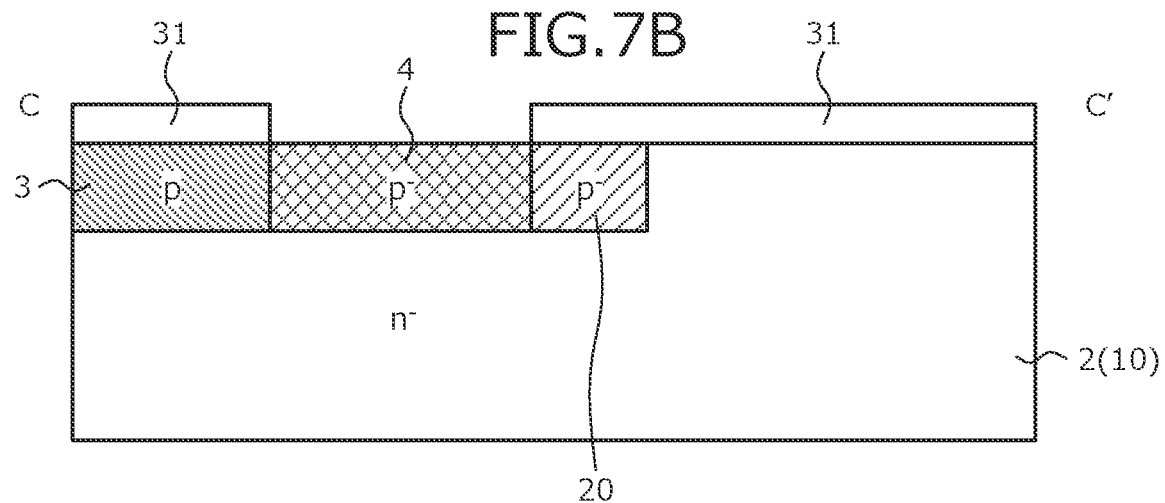
Figure 7C:
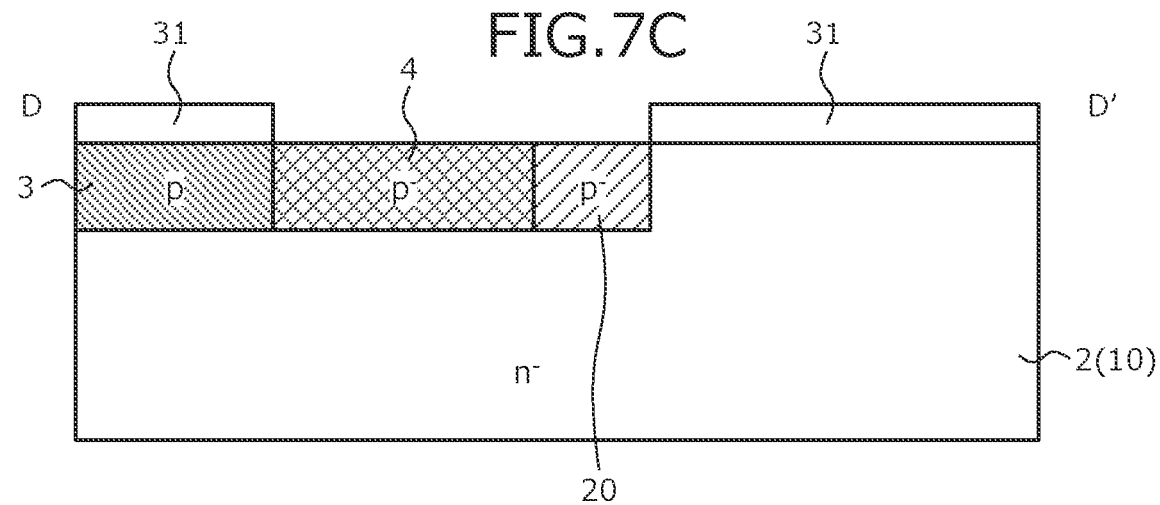
Figure 8A:
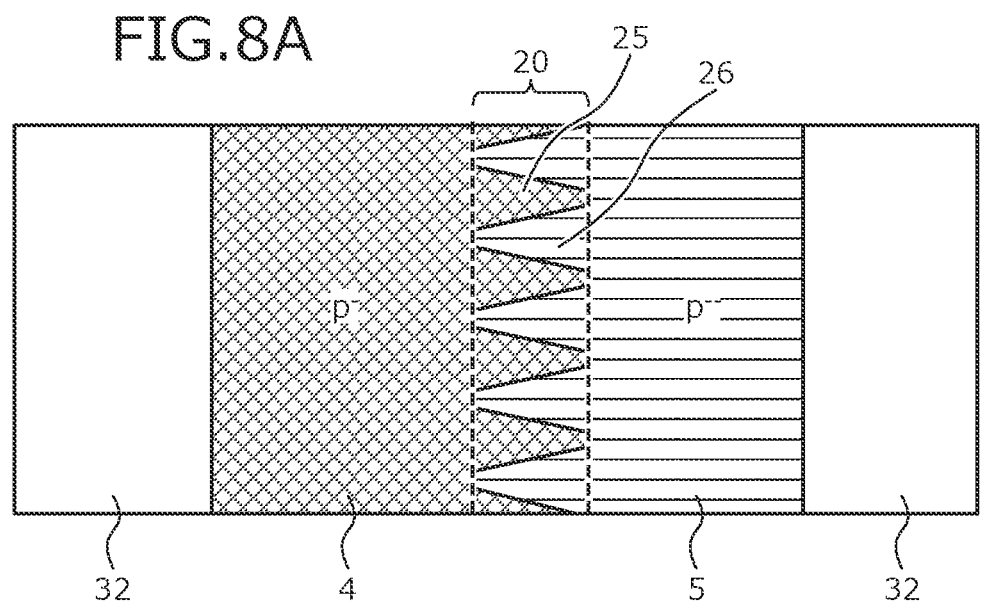

A method of manufacturing a semiconductor device according to a fourth embodiment will be described in terms of a method of manufacturing the semiconductor device according to the third embodiment with reference to FIGS. 1A, 1B, 7A to 7C, 8A, and 8B. FIGS. 7A to 7C, 8A, and 8B are cross-sectional views of a state during manufacturing of the semiconductor device according to the fourth embodiment. FIG. 7A depicts a planar structure during manufacturing. FIG. 7B depicts a cross-sectional structure taken along a cutting line C-C' of FIG. 7A, and FIG. 7C depicts a cross-sectional structure taken along a cutting line D-D' of FIG. 7A. The cutting line C-C' is a cutting line parallel to the normal direction X and passing through a formation region of the second subregions 26. The cutting line D-D' is a cutting line parallel to the normal direction X and passing through a formation region of the first subregions 25. FIGS. 8A and 8B depict a planar structure and a cross-sectional structure, respectively, during manufacturing.

First, the $n^+$-type silicon carbide substrate (semiconductor wafer) 1 having a predetermined impurity concentration and a predetermined thickness is prepared. A silicon carbide epitaxial layer serving as the $n^-$-type drift layer 2 is grown on the front surface of the $n^+$-type silicon carbide substrate 1 to produce an epitaxial wafer (the silicon carbide base 10). The p-type guard ring 3 is selectively formed into, for example, an annular planar shape surrounding the periphery of the active region 11 by photolithography and ion implantation of p-type impurities in the termination structure portion 12 surrounding the periphery of the active region 11 in the surface layer of the front surface (the surface on the $n^-$-type drift layer 102 side) of the silicon carbide base 10.

Subsequently, as depicted in FIGS. 7A to 7C, a first ion implantation mask 31 made of a resist material or an oxide film ($SiO_2$), for example, and opened in the formation regions of the first JTE region 4 and the first subregions 25 is formed on the front surface of the silicon carbide base 10. A first ion implantation of p-type impurities, for example, aluminum (Al), is performed by using the first ion implantation mask 31 as a mask to selectively form each of the first JTE region 4 and the first subregions 25 in the surface layer of the $n^-$-type drift layer 2. The first ion implantation mask 31 is removed.

Subsequently, as depicted in FIGS. 8A and 8B, a second ion implantation mask 32 made of a resist material or an oxide film, for example, and opened in the formation regions of the first and second JTE region 4, 5 and the first and second subregions 25, 26 is formed on the surface of the $n^-$-type drift layer 2. A second ion implantation of p-type impurities, for example, aluminum, is performed by using the second ion implantation mask 32 as a mask to selectively form each of the second JTE region 5 and the second subregions 26 in the surface layer of the $n^-$-type drift layer 2. This second ion implantation makes the impurity concentration higher in the first JTE region 4 and the first subregions 25 already formed.

By covering the formation regions of the second subregions 26 with the first ion implantation mask 31 as described above, the first and second subregions 25, 26 having the substantially trapezoidal shape can easily be formed. Additionally, the two ion implantations (first and second ion implantations) enable the formation of the JTE structure with the two-layer structure (the first and second JTE regions 4, 5) having the impurity concentration reduced in two stages and the formation of the electric field relaxation region 20 made up of the first and second subregions 25, 26 different in the impurity concentration. Therefore, the electric field relaxation region 20 is formed that has the average impurity concentration distribution decreasing at a constant rate from the active region 11 side in the outward direction. After the second ion implantation mask 32 is removed, subsequent typical manufacturing process steps (e.g., formation of the interlayer insulating film 7, the anode electrode 8, and the cathode electrode 9) are performed to complete the SBD depicted in FIGS. 1A, 1B, 7A to 7C, 8A, and 8B.

In the method of manufacturing a semiconductor device according to the fourth embodiment described above, the planar shapes of the first and second subregions making up the electric field relaxation region 20 can variously be changed depending on a pattern of the first ion implantation mask 31. Therefore, by applying the fourth embodiment to form the first and second subregions into rectangular shapes or planar shapes having curved portions, the semiconductor devices according to the first and second embodiments may be produced.

As described above, according to the fourth embodiment, the same effect as the first to third embodiments may be produced.

A structure of a semiconductor device according to a fifth embodiment will be described. FIGS. 9A and 9B are explanatory views of the structure of the semiconductor device according to the fifth embodiment. FIG. 9A depicts a planar layout in the linear portions of the JTE structure and FIG. 9B depicts an enlarged view of a cross-sectional structure of the JTE structure. The semiconductor device according to the fifth embodiment is different from the semiconductor device according to the third embodiment in that a second electric field relaxation region 40 contacting the outside end portion of the second JTE region 5 is disposed outside the second JTE region 5. Therefore, the p-type guard ring 3, the first JTE region 4, the electric field relaxation region (hereinafter referred to as the first electric field relaxation region) 20, the second JTE region 5, and the second electric field relaxation region 40 are arranged in this order from the inside into a concentric shape around the active region 11.

The second electric field relaxation region 40 is formed by alternately repeatedly arranging $p^-$-type regions (hereinafter referred to as third subregions) 41 and $n^-$-type regions (hereinafter referred to as fourth subregions) 42 in the tangential direction Y. Therefore, the second electric field relaxation region 40 forms the SJ structure having the third subregions 41 and the fourth subregions 42 alternately repeatedly arranged as a parallel pn layer. Thus, the third subregions 41 and the fourth subregions 42 are preferably charge-balanced. The impurity concentration of the third subregions 41 is substantially equal to the impurity concentration of the second JTE region 5. The impurity concentration of the fourth subregions 42 is substantially equal to the impurity concentration of the $n^-$-type drift layer 2. The average impurity concentration of the second electric field relaxation region 40 is lower than the impurity concentration of the second JTE region 5.

For example, the third subregions 41 have the same planar shape as the first subregions 25. Therefore, the third subregions 41 have a substantially trapezoidal planar shape having the upper base defined by the boundary 20a with the first JTE region 4 and the lower base defined by the boundary 20b with the second JTE region 5 such that a width (lower base) in the tangential direction Y on the outside (the chip outer peripheral portion side) is made narrower than a width (upper base) in the tangential direction Y on the inside (the second JTE region 5 side). The fourth subregions 42 have the same planar shape as the second subregions 26. Therefore, the fourth subregions 42 have a substantially trapezoidal planar shape having the upper base defined by the boundary 20a with the first JTE region 4 and the lower base defined by the boundary 20b with the second JTE region 5 such that a width (lower base) in the tangential direction Y on the outside is made wider than a width (upper base) in the tangential direction Y on the inside. As a result, the average impurity concentration of the second electric field relaxation region 40 is set to a value closer to the impurity concentration of the second JTE region 5 in a portion on the second JTE region 5 side and is set to a value closer to the impurity concentration of the n⁻-type drift layer 2 in a portion on the chip outer peripheral portion side. As is the case with the first electric field relaxation region 20, the average impurity concentration distribution of the second electric field relaxation region 40 is a distribution decreasing at a constant rate from the active region 11 side in the outward direction.

Although not depicted, the planar shapes of the third and fourth subregions 41, 42 in the corner portions 14b are substantially trapezoidal shapes based on the curvature of the circular arc shape of the corner portions 14b as is the case with the first embodiment. The dimensions of the third and fourth subregions 41, 42 may be determined such that the third subregions 41 and the fourth subregions 42 are charge-balanced as is the case with the first embodiment.

In the method of manufacturing the semiconductor device according to the fifth embodiment, for example, a second ion implantation mask made of a resist material or an oxide film, for example, and opened in the formation regions of the first and second JTE region 4, 5 and the first to third subregions 25, 26, 41 may be formed in the method of manufacturing the semiconductor device according to the fourth embodiment. The conditions of the method of manufacturing the semiconductor device according to the fifth embodiment are the same as the fourth embodiment except the second ion implantation mask.

As described above, according to the fifth embodiment, the same effect as the first to fourth embodiments may be produced. According to the fifth embodiment, by disposing the second electric field relaxation region outside the second JTE region, the electric field may be relaxed at the boundary between the second JTE region and the second electric field relaxation region. Therefore, the electric field can further be relaxed in the termination structure portion.

A structure of a semiconductor device according to a sixth embodiment will be described. FIGS. 10A and 10B are explanatory views of the structure of the semiconductor device according to the sixth embodiment. FIG. 10A depicts a planar layout in the linear portions of the JTE structure and FIG. 10B depicts an enlarged view of a cross-sectional structure of the JTE structure. The semiconductor device according to the sixth embodiment is different from the semiconductor device according to the fifth embodiment in that a third JTE region (p⁻-type region) 6 and a third electric field relaxation region 50 are further disposed outside the second electric field relaxation region 40. For example, the p-type guard ring 3, the first JTE region 4, the first electric field relaxation region 20, the second JTE region 5, the second electric field relaxation region 40, the third JTE region 6, and the third electric field relaxation region 50 are arranged in this order from the inside into a concentric shape around the active region 11.

The configuration of the second electric field relaxation region 40 is the same as the first electric field relaxation region 20. Therefore, the average impurity concentration of the second electric field relaxation region 40 is lower than the impurity concentration of the second JTE region 5 adjacent inside and is higher than the impurity concentration of the third JTE region 6 adjacent outside. For example, the second electric field relaxation region 40 is formed by alternately repeatedly arranging the third subregions 41 and fourth subregions 43 in the tangential direction Y. The configuration of the third subregions 41 is the same as the fifth embodiment. The impurity concentration of the fourth subregions 43 is substantially equal to the impurity concentration of the third JTE region 6. The configuration of the fourth subregions 43 except the impurity concentration is the same as the fourth subregions of the fifth embodiment.

The third electric field relaxation region 50 is disposed outside the third JTE region 6 and contacts the outside end portion of the third JTE region 6. The third electric field relaxation region 50 is formed by alternately repeatedly arranging p⁻-type regions (hereinafter referred to as fifth subregions) 51 and n⁻-type regions (hereinafter referred to as sixth subregions) 52 in the tangential direction Y. Therefore, the third electric field relaxation region 50 forms the SJ structure having the fifth subregions 51 and the sixth subregions 52 alternately repeatedly arranged as a parallel pn layer. Thus, the fifth subregions 51 and the sixth subregions 52 are preferably charge-balanced. The impurity concentration of the fifth subregions 51 is substantially equal to the impurity concentration of the third JTE region 6. The impurity concentration of the sixth subregions 52 is substantially equal to the impurity concentration of the n⁻-type drift layer 2. The average impurity concentration of the third electric field relaxation region 50 is lower than the impurity concentration of the third JTE region 6.

For example, the fifth subregions 51 have the same planar shape as the first subregions 25. Therefore, the fifth subregions 51 have a substantially trapezoidal planar shape having the upper base defined by the boundary 20a with the first JTE region 4 and the lower base defined by the boundary 20b with the second JTE region 5 such that a width (lower base) in the tangential direction Y on the outside (the chip outer peripheral portion side) is made narrower than a width (upper base) in the tangential direction Y on the inside (the third JTE region 6 side). The sixth subregions 52 have the same planar shape as the second subregions 26. Therefore, the sixth subregions 52 have a substantially trapezoidal planar shape having the upper base defined by the boundary 20a with the first JTE region 4 and the lower base defined by the boundary 20b with the second JTE region 5 such that a width (lower base) in the tangential direction Y on the outside is made wider than a width (upper base) in the tangential direction Y on the inside. As a result, the average impurity concentration of the third electric field relaxation region 50 is set to a value closer to the impurity concentration of the third JTE region 6 in a portion on the third JTE region 6 side and is set to a value closer to the impurity concentration of the n⁻-type drift layer 2 in a portion on the chip outer peripheral portion side. As is the case with the first electric field relaxation region 20, the average impurity concentration distribution of the third electric field relaxation region 50 is a distribution decreasing at a constant rate from the active region 11 side in the outward direction.

Although not depicted, the planar shapes of the fifth and sixth subregions 51, 52 in the corner portions 14b are substantially trapezoidal shapes based on the curvature of the circular arc shape of the corner portions 14b as is the case with the first embodiment. The dimensions of the fifth and sixth subregions 51, 52 may be determined such that the fifth subregions 51 and the sixth subregions 52 are charge-balanced as is the case with the first embodiment.

In the method of manufacturing the semiconductor device according to the sixth embodiment, for example, a third ion implantation may further be performed after the two ion implantations (the first and second ion implantations) in the method of manufacturing the semiconductor device according to the fifth embodiment. For example, the first and second ion implantations are performed in the same way as the fifth embodiment. Subsequently, the third ion implantation is performed by using a third ion implantation mask made of a resist material or an oxide film, for example, and opened in the formation regions of the first and second JTE region 4, 5 and the first to fifth subregions 25, 26, 41, 43, 51. The three ion implantations (first to third ion implantations) enable the formation of the JTE structure with the three-layer structure (the first to three JTE regions 4 to 6) having the impurity concentration reduced in three stages and the formation of the first to third electric field relaxation regions 20, 40, 50 outside the first to third JTE regions 4 to 6, respectively. The conditions of the method of manufacturing the semiconductor device according to the sixth embodiment are the same as the fifth embodiment except the third ion implantation.

As described above, according to the sixth embodiment, the same effect as the first to fifth embodiments may be produced. According to the sixth embodiment, by increasing the numbers of the JTE regions and the electric field relaxation regions, margins of breakdown voltage of the termination structure portion may be expanded with respect to ion implantation accuracy (a dose amount, a diffusion depth) when a p-type region making up the JTE structure is formed. Although the numbers of the JTE regions and the electric field relaxation regions can further be increased, considering an increase in the number of processes for photolithography and ion implantation, it is presumed that the JTE structure with two- or three-layer structure is practical.

Figure 19A:
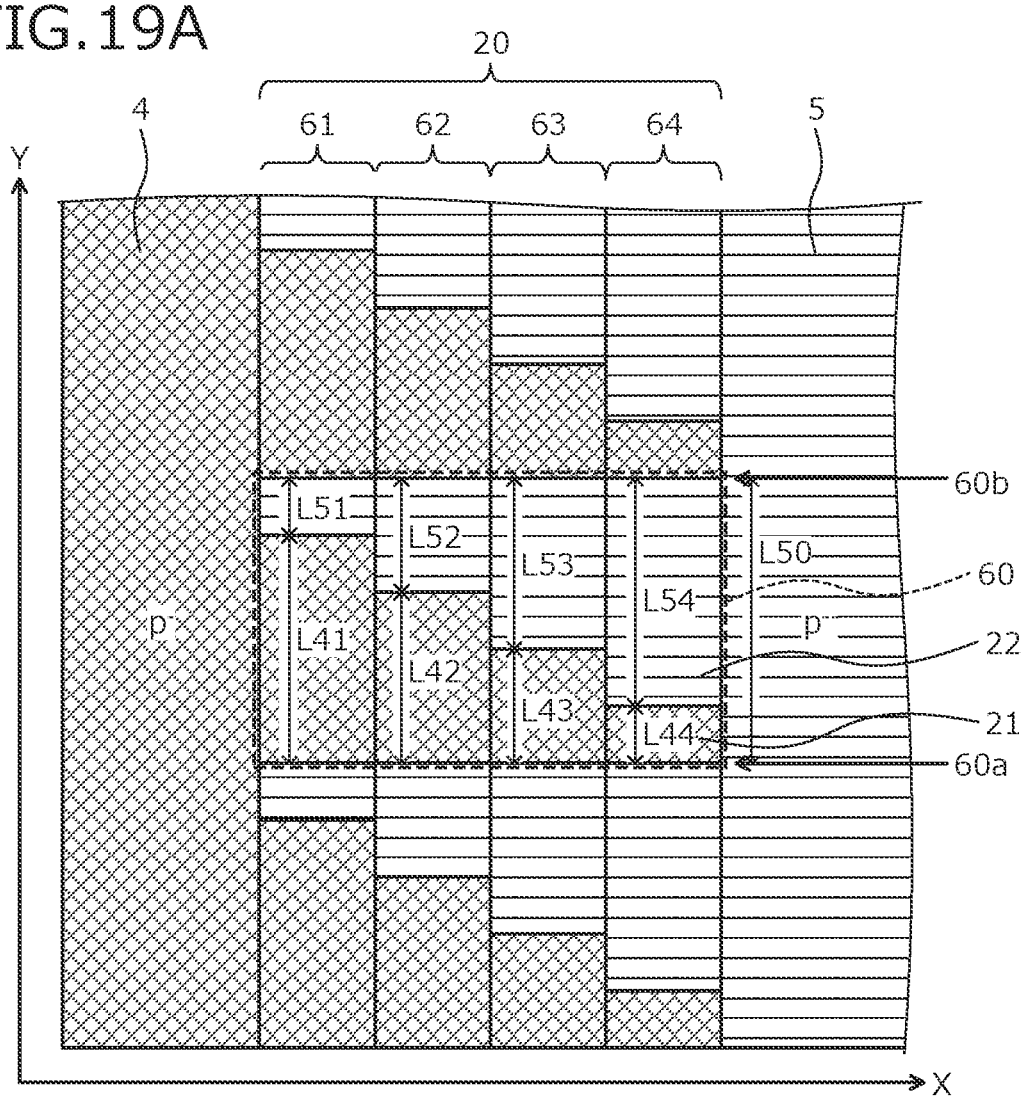
FIGS. 19A, 19B, and 19C are plane views of a structure of a semiconductor device according to a seventh embodiment.
Figure 19B:
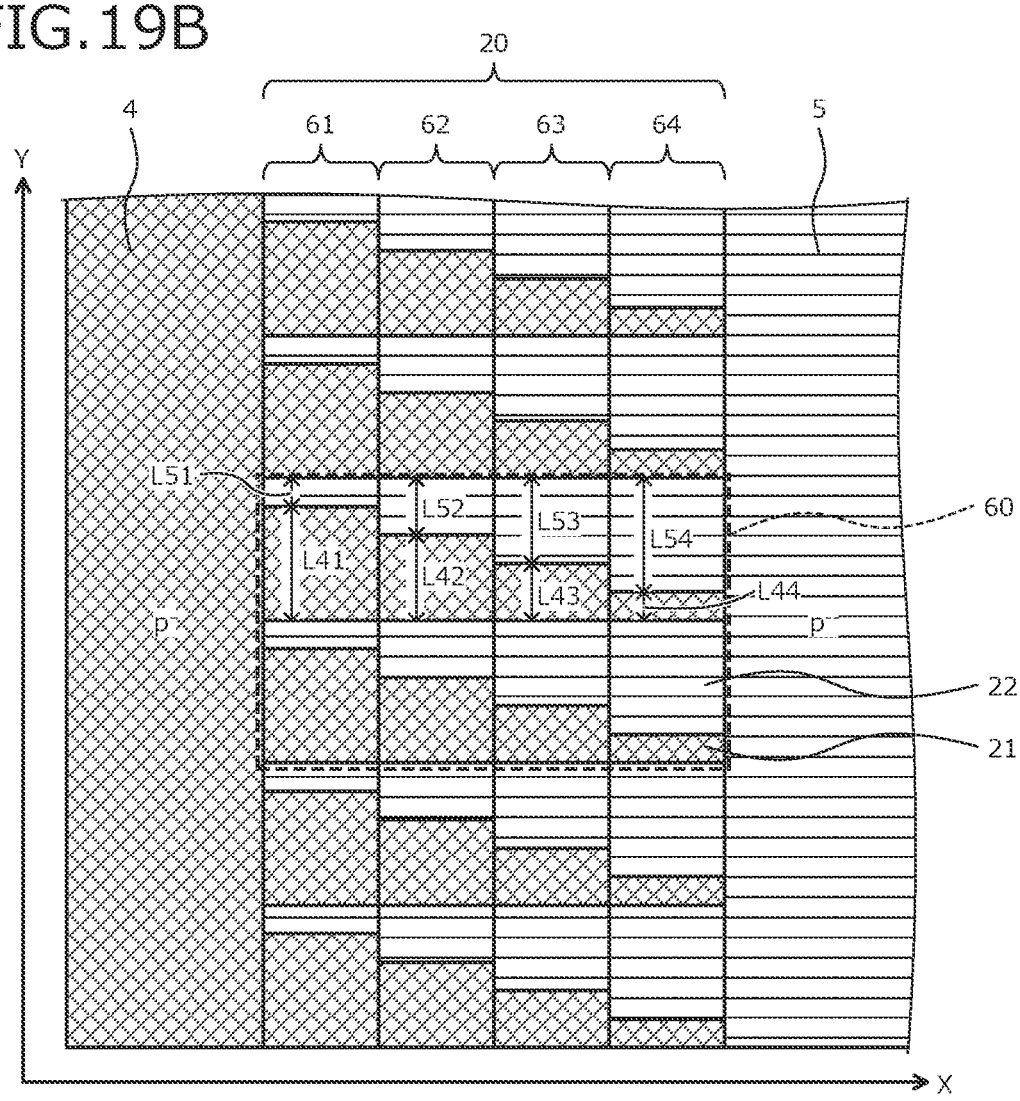
Figure 19C:
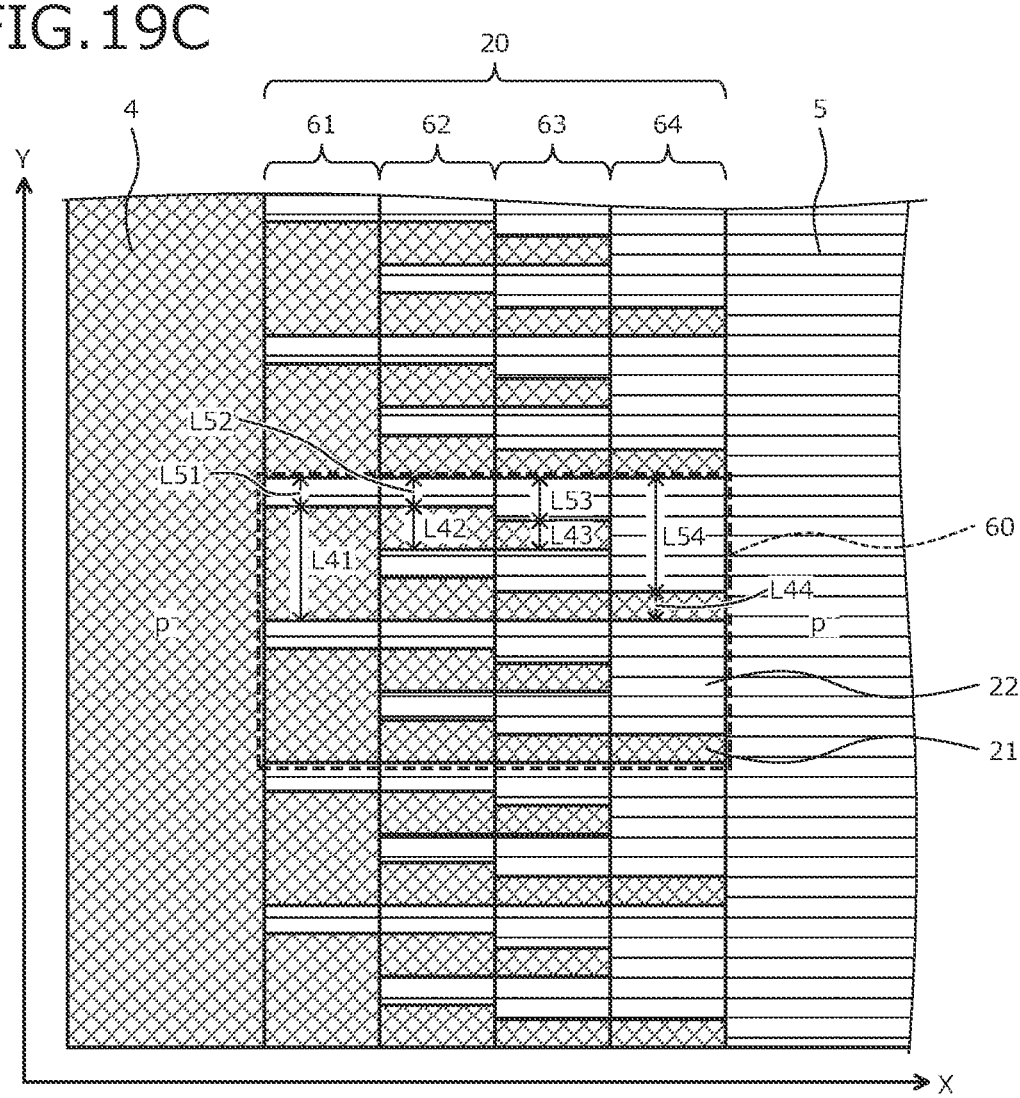

A structure of a semiconductor device according to a seventh embodiment will be described. FIGS. 19A, 19B, and 19C are plane views of the structure of the semiconductor device according to the seventh embodiment. The semiconductor device according to the seventh embodiment is different from the semiconductor device according to the first embodiment in that the electric field relaxation region 20 is equally divided in the normal direction X into multiple sections (in this example, four sections denoted by reference numerals 61 to 64 from the inside to the outside) so as to arrange first and second subregions 21, 22 different in width in the tangential direction Y in the respective sections 61 to 64. The electric field relaxation region 20 is divided into unit (unit region) portions 60 in the tangential direction Y and has a planar layout in which a planar layout of the unit portion 60 is repeatedly disposed as a basic pattern in the tangential direction Y. The unit portion 60 includes a set of the first and second subregions 21, 22 neighboring in the tangential direction Y for each of the sections 61 to 64. Therefore, the unit portion 60 includes the sets of the first and second subregions 21, 22 neighboring in the tangential direction Y to the number of sets neighboring in the normal direction X (to the number of layers: a portion surrounded by a dotted rectangular frame).

Widths L41 to L44 in the tangential direction Y of the first subregions 21 in the sections 61 to 64 are set such that the first subregions of the sections disposed on the outer side have narrower widths. Widths L51 to L54 in the tangential direction Y of the second subregions 22 in the sections 61 to 64 are set such that the second subregions of the sections disposed on the outer side have wider widths. The sections 61 to 64 inside each of the unit portions 60 are equal in terms of a sum L50 of the widths in the tangential direction Y of a set of the first and second subregions 21, 22 neighboring in the tangential direction Y (i.e., the width in the tangential direction Y of the unit portion 60) and are arranged in the unit section 60 such that the unit portion 60 has a rectangular planar shape. Therefore, all the first subregions 21 inside the unit portion 60 have one end portion in the tangential direction Y located on an end portion 60a of the unit portion 60 on one side in the tangential direction Y. All the second subregions 22 inside the unit portion 60 have one end portion in the tangential direction Y located on an end portion 60b of the unit portion 60 on the other side in the tangential direction Y. Therefore, the first subregions 21 have the widths L41 to L44 made narrower in steps toward the outside on the other end portion side in the tangential direction Y located closer to the center of the unit portion 60. The second subregions 22 have the widths L51 to L54 made wider in steps toward the outside on the other end portion side in the tangential direction Y located closer to the center of the unit portion 60.

When the impurity concentration of the first JTE region 4 is $n_{p1}$ and the impurity concentration of the second JTE region 5 is $n_{p2}$, an average impurity concentration Np of each of the sections 61 to 64 is equivalent to Equation (2) below. Y1 and Y2 are respective widths in the tangential direction Y of the first and second subregions 21, 22 in the sections 61 to 64. Therefore, when the average impurity concentration Np of the section 61 is calculated, Y1 and Y2 are the widths L41 and L51, respectively, in the tangential direction Y of the first and second subregions 21 and 22 in the section 61. As described above, the widths L41 to L44 in the tangential direction Y of the first subregions 21 are narrower in the sections 61 to 64 disposed on the outer side, and the widths L51 to L54 in the tangential direction Y of the second subregions 22 are wider in the sections disposed on the outer side. Therefore, the average impurity concentration Np of the sections 61 to 64 are lower in the sections disposed on the outer side, and the average impurity concentration of the unit portion 60 is reduced toward the outer periphery.

$$Np=((Y1 \times n_{p1})+(Y2 \times n_{p2}))/(Y1+Y2) \qquad (2)$$

FIGS. 19B and 19C depict modification examples of the semiconductor device according to the seventh embodiment. As depicted in FIGS. 19B and 19C, the first and second subregions 21, 22 in each of the unit portions 60 may further be divided in the tangential direction Y. For example, for each section in each of the unit portions 60, a set of the first and second subregions 21, 22 having respective widths acquired by dividing the widths Y1, Y2 of the first and second subregions 21, 22 of FIG. 19A by a division number is repeated and disposed by the division number in the tangential direction Y. FIG. 19B depicts the case that all the first and second subregions 21, 22 in each of the unit portions 60 are each divided into two subregions in the tangential direction Y. FIG. 19C depicts the case that the sections 62, 63 are each further divided into two in the tangential direction Y in the unit portion 60 of FIG. 19B (i.e., the unit portion 60 of FIG. 19A is divided into four in the tangential direction Y). Even when the first and second subregions 21, 22 are divided in the tangential direction Y, the respective total areas of the first and second subregions 21, 22 are not changed in each of the sections 61 to 64 in the unit portion 60 and therefore, the unit portions 60 of FIGS. 19B and 19C have the same average impurity concentration as the unit portion 60 of FIG. 19A. The division number in the tangential direction Y of the unit portion 60 is determined by a process limit of a photoetching step. Preferably, the division number in the tangential direction Y is optimized for each of the sections 61 to 64 in the unit portion 60 to narrow the widths in the tangential direction Y of the first and second subregions 21, 22. For example, preferably, the first subregions 21 or the second subregions 22 are divided into minute regions having a limit value of the process limit such that all the sets of the first and second subregions 21, 22 neighboring in the tangential direction Y inside the sections 61 to 64 have the same average impurity concentration. As a result, all the sets of the first and second subregions 21, 22 neighboring in the tangential direction Y may be made closer to substantially the same average impurity concentration and the electric field intensity is relaxed.

The seventh embodiment may be applied to the second and third embodiments to dispose the unit portions having a planer shape other than the rectangular shape. The seventh embodiment may be applied to the fifth and sixth embodiments to further dispose the second and third electric field relaxation regions having the configuration of the electric field relaxation region 20 of the seventh embodiment.

As described above, according to the seventh embodiment, the same effect as the first to sixth embodiments may be produced.

Figure 11:
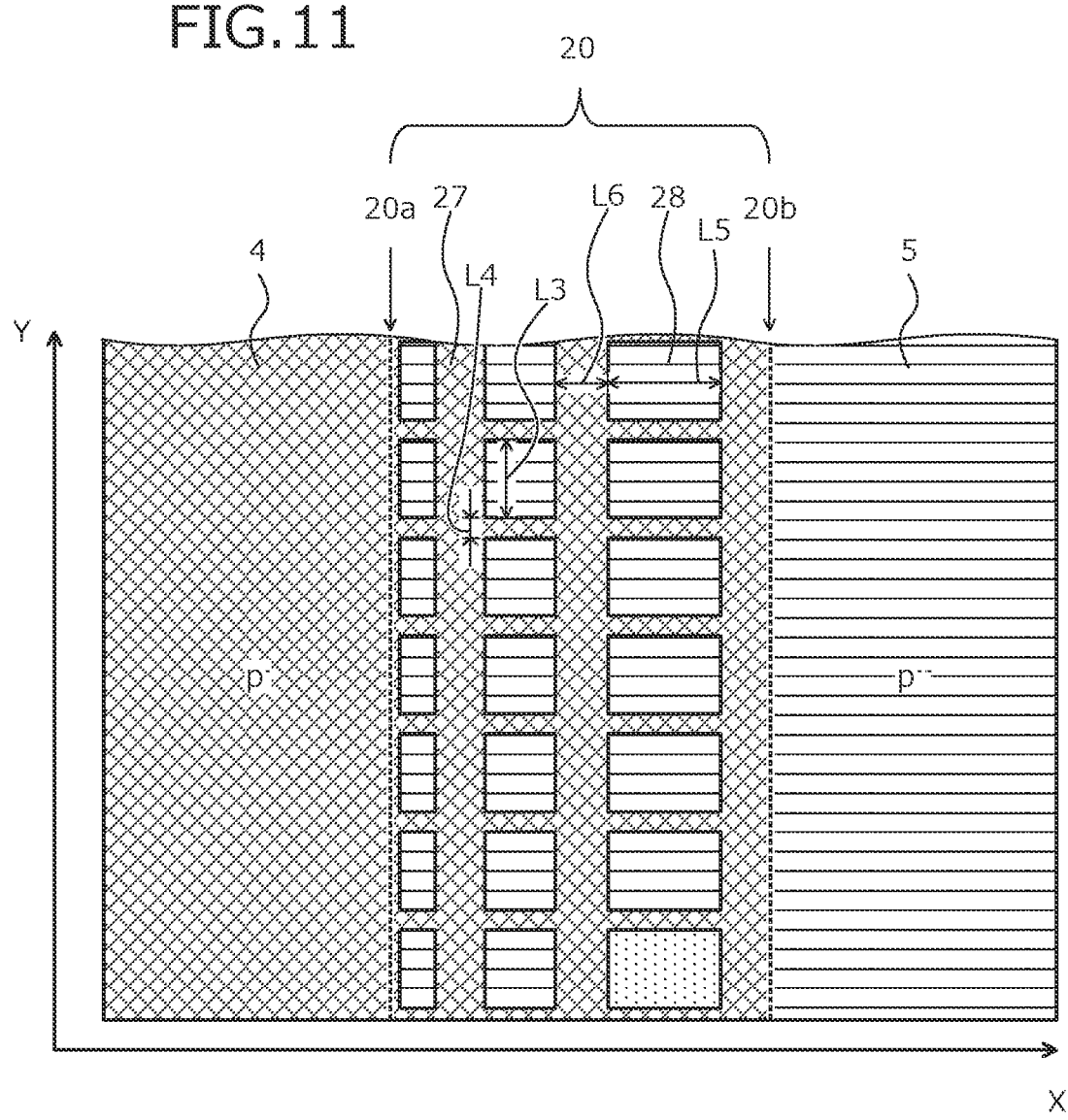
FIG. 11 is a plane view of a structure of a semiconductor device according to an eighth embodiment.

A structure of a semiconductor device according to an eighth embodiment will be described. FIG. 11 is a plane view of the structure of the semiconductor device according to the eighth embodiment. FIG. 11 depicts an enlarged view of a planar layout in the linear portion of the JTE structure of FIG. 1A (the portion surrounded by the rectangular frame 13). The semiconductor device according to the eighth embodiment is different from the semiconductor device according to the first embodiment in that first subregions 27 are disposed in a mesh-shaped planar pattern to adjust a reduction amount of the average impurity concentration distribution reduced outward from the active region 11 side.

For example, as depicted in FIG. 11, the first subregions 27 are disposed in a mesh-shaped planar pattern. Second subregions 28 are disposed in portions other than the first subregions 27 in the electric field relaxation region 20. Therefore, the multiple second subregions 28 are arranged in a matrix shape. All the second subregions 28 are substantially equal to each other in terms of a width L3 in the tangential direction Y. A width L5 in the normal direction X of the second subregions 28 is made wider in the second subregions 28 disposed closer to the second JTE region 5. For example, the second subregions 28 are arranged in parallel to the tangential direction Y at equal intervals L4 and arranged in parallel to the normal direction X at equal intervals L6.

By arranging the second subregions 28 in this way, the occupation area of the first subregions 27 is made smaller and the occupation area of the second subregions 28 is made larger in the electric field relaxation region 20 from the active region 11 side toward the outside. As a result, the average impurity concentration distribution of the electric field relaxation region 20 is reduced from the active region 11 side in the outward direction. Preferably, the intervals L4 between the second subregions 28 neighboring in the tangential direction Y and the intervals L6 between the second subregions 28 neighboring in the normal direction X are distances allowing depletion layers extending from the second subregions 28 to contact each other before reaching the dielectric breakdown voltage of the termination structure portion 12.

Although not depicted, the planar shapes of the second subregions 28 in the corner portions 14b are substantially trapezoidal shapes based on the curvature of the circular arc shape of the corner portions 14b as is the case with the first embodiment, and the planar shape of the first subregion 27 is a mesh shape surrounding the substantially trapezoidal second subregions 28. The electric field relaxation region 20 configured as described above has a configuration substantially equivalent to the state in which the first and second subregions 27, 28 are each arranged in a stripe shape extending in the normal direction X as is the case with the first embodiment. Therefore, the dimensions of the first and second subregions 27, 28 may be determined based on a ratio of dose amounts of the ion implantations for forming the first and second subregions 27, 28 as is the case with the first embodiment.

As described above, according to the eighth embodiment, the same effect as the first to fourth embodiments may be produced.

Figure 12:
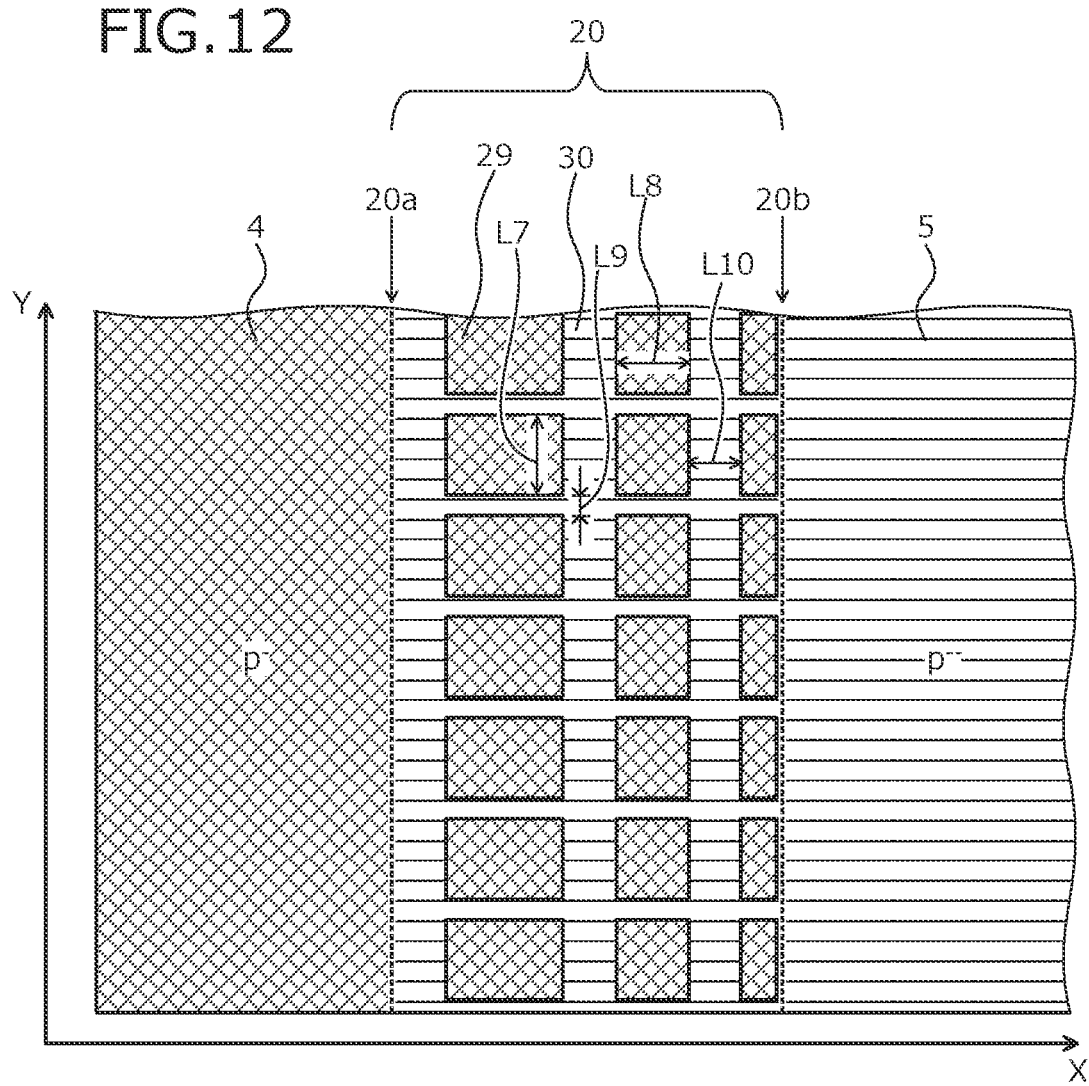
FIG. 12 is a plane view of a structure of a semiconductor device according to a ninth embodiment.

A structure of a semiconductor device according to a ninth embodiment will be described. FIG. 12 is a plane view of the structure of the semiconductor device according to the ninth embodiment. FIG. 12 depicts an enlarged view a planar layout in the linear portion of the JTE structure of FIG. 1A (the portion surrounded by the rectangular frame 13). The semiconductor device according to the eighth embodiment is different from the semiconductor device according to the eighth embodiment in that first subregions 29 are disposed in a matrix-shaped planar pattern to adjust a reduction amount of the average impurity concentration distribution reduced outward from the active region 11 side.

For example, as depicted in FIG. 12, the multiple first subregions 29 are arranged in a matrix shape. All the first subregions 29 are substantially equal to each other in terms of a width L7 in the tangential direction Y. A width L8 in the normal direction X of the first subregions 29 is made narrower in the first subregions 29 disposed closer to the second JTE region 5. For example, the first subregions 29 are arranged in parallel to the tangential direction Y at equal intervals L9 and arranged in parallel to the normal direction X at equal intervals L10. Second subregions 30 are disposed in portions other than the first subregions 29 in the electric field relaxation region 20. Therefore, the multiple second subregions 30 are arranged in a mesh shape surrounding the first subregions 29.

By arranging the first subregions 29 in this way, the occupation area of the first subregions 29 is made smaller and the occupation area of the second subregions 28 is made larger in the electric field relaxation region 20 from the active region 11 side toward the outside. As a result, the average impurity concentration distribution of the electric field relaxation region 20 is reduced from the active region 11 side in the outward direction. Preferably, the intervals L9 between the first subregions 29 neighboring in the tangential direction Y and the intervals L10 between the first subregions 29 neighboring in the normal direction X are distances allowing depletion layers extending from the first subregions 29 to contact with each other before reaching the dielectric breakdown voltage of the termination structure portion 12.

Although not depicted, the planar shapes of the first subregions 29 in the corner portions 14b are substantially trapezoidal shapes based on the curvature of the circular arc shape of the corner portions 14b as is the case with the first embodiment, and the planar shape of the second subregions 30 is a mesh shape surrounding the substantially trapezoidal first subregions 29. Also in the ninth embodiment, the electric field relaxation region 20 has a configuration substantially equivalent to the state in which the first and second subregions 29, 30 are each arranged in a stripe shape extending in the normal direction X as is the case with the eighth embodiment. Therefore, the dimensions of the first and second subregions 29, 30 may be determined in the same way as the eighth embodiment.

As described above, according to the ninth embodiment, the same effect as the first to fourth embodiments may be produced.

Figure 13:
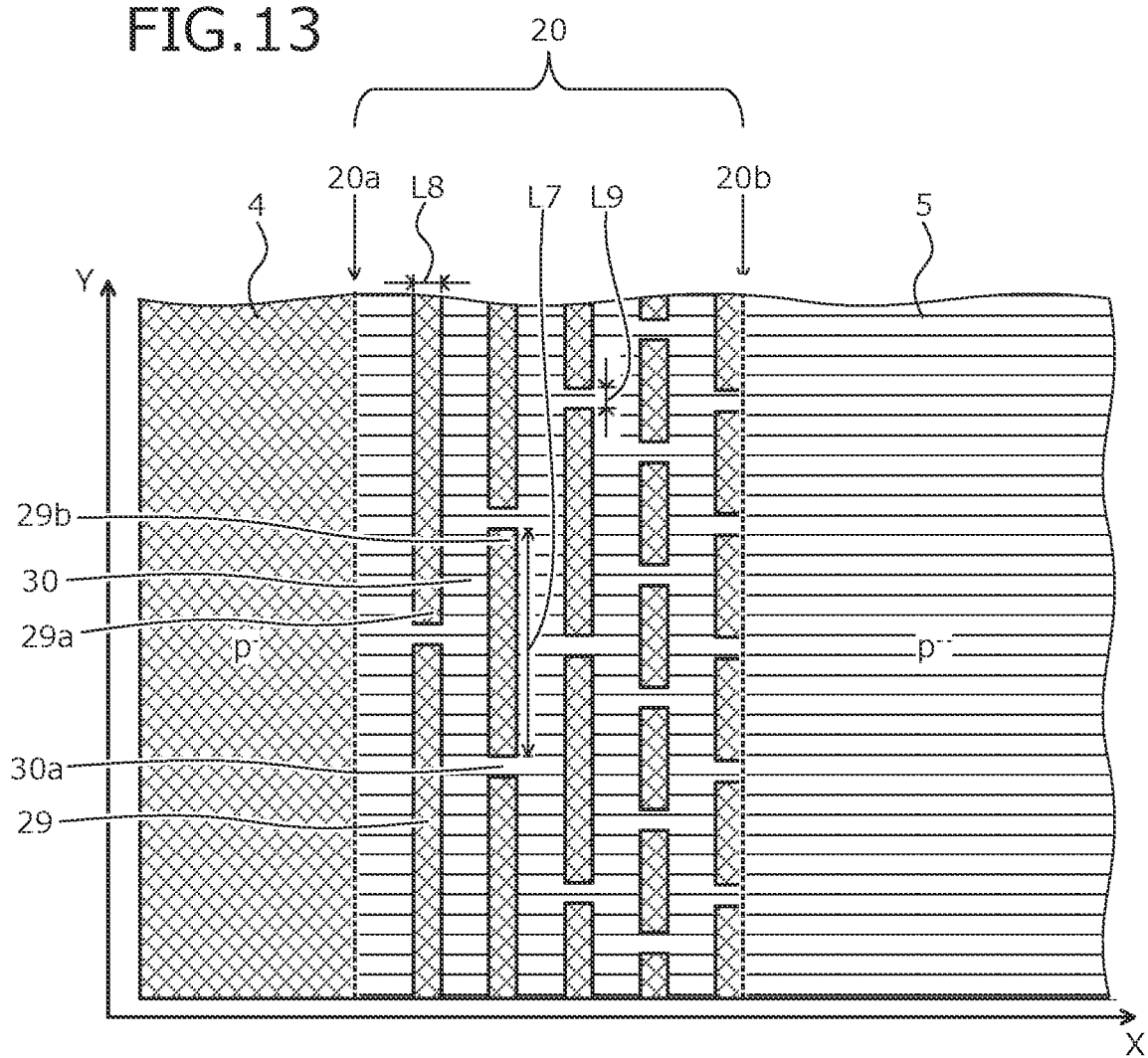
FIG. 13 is a plane view of a structure of a semiconductor device according to a tenth embodiment.

A structure of a semiconductor device according to a tenth embodiment will be described. FIG. 13 is a plane view of the structure of the semiconductor device according to the tenth embodiment. FIG. 13 depicts an enlarged view of a planar layout in the linear portion of the JTE structure of FIG. 1A (the portion surrounded by the rectangular frame 13) (the same applies to FIGS. 14 to 16). The semiconductor device according to the tenth embodiment is different from the semiconductor device according to the ninth embodiment in that a width L7 in the tangential direction Y of the first subregions 29 is made narrower in the first subregions 29 disposed closer to the second JTE region 5. The planer shapes of the first subregions 29 are, for example, linear shapes extending in the tangential direction Y. For example, all the first subregions 29 are equal to each other in terms of a width L8 in the normal direction X. The first subregions 29 neighboring in the tangential direction Y are arranged at equal intervals L9.

By making the width L7 in the tangential direction Y of the first subregions 29 narrower in the first subregions 29 disposed closer to the second JTE region 5, the occupation area of the first subregions 29 is made smaller in the electric field relaxation region 20 from the active region 11 side toward the outside as is the case with the ninth embodiment. Therefore, the average impurity concentration distribution in the electric field relaxation region 20 may be adjusted. Portions 30a of the second subregions 30 interposed between the first subregions 29 neighboring in the tangential direction Y do not face each other in the normal direction X. Therefore, the first subregions 29 may be arranged such that end portions 29a, 29b in the tangential direction Y of the first subregions 29 neighboring in the normal direction X do not face each other in the normal direction X. As a result, local concentration of the electric field may be avoided, and a substantial breakdown voltage may be ensured in the termination structure portion 12.

Figure 14:
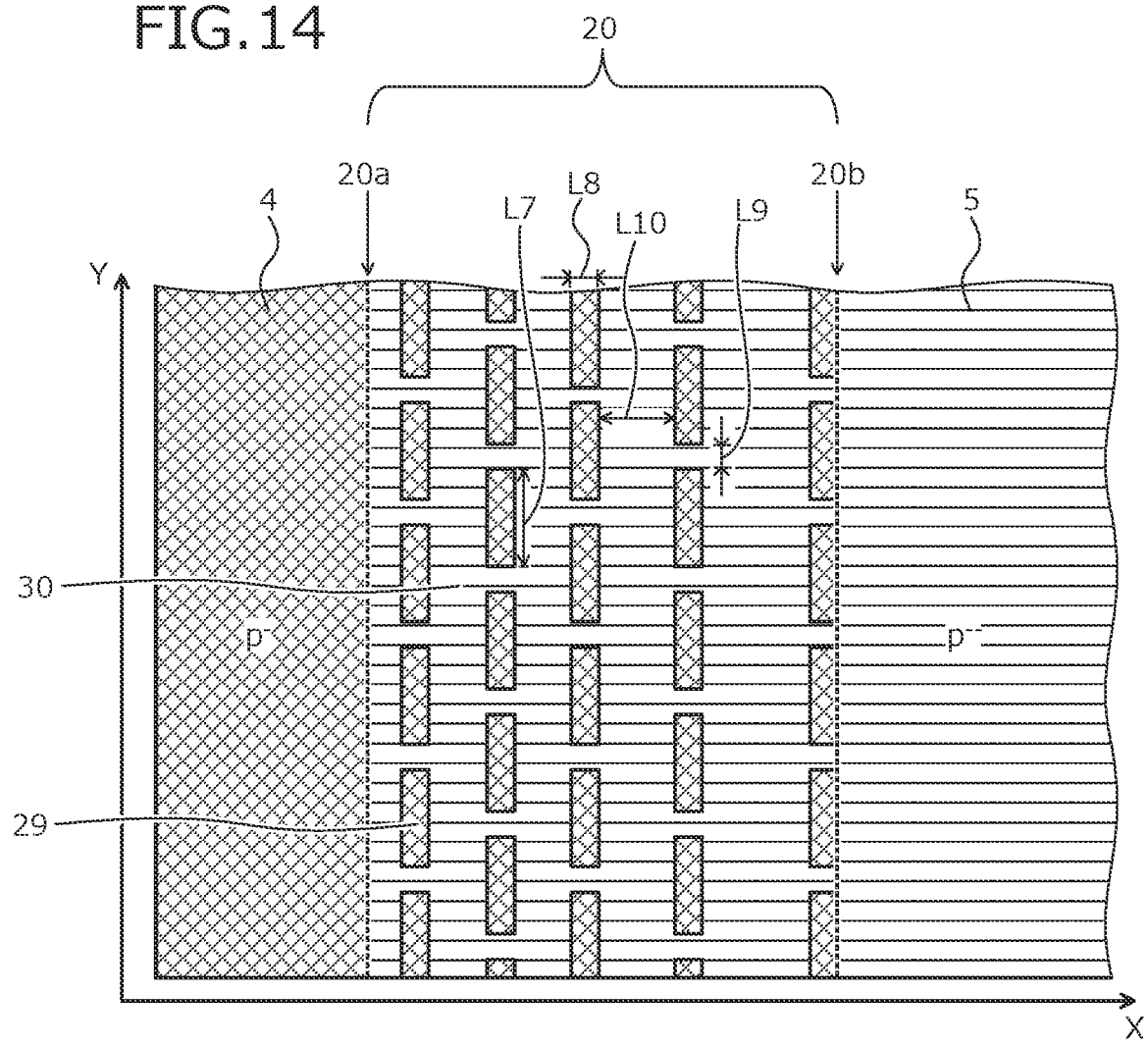
Figure 15:
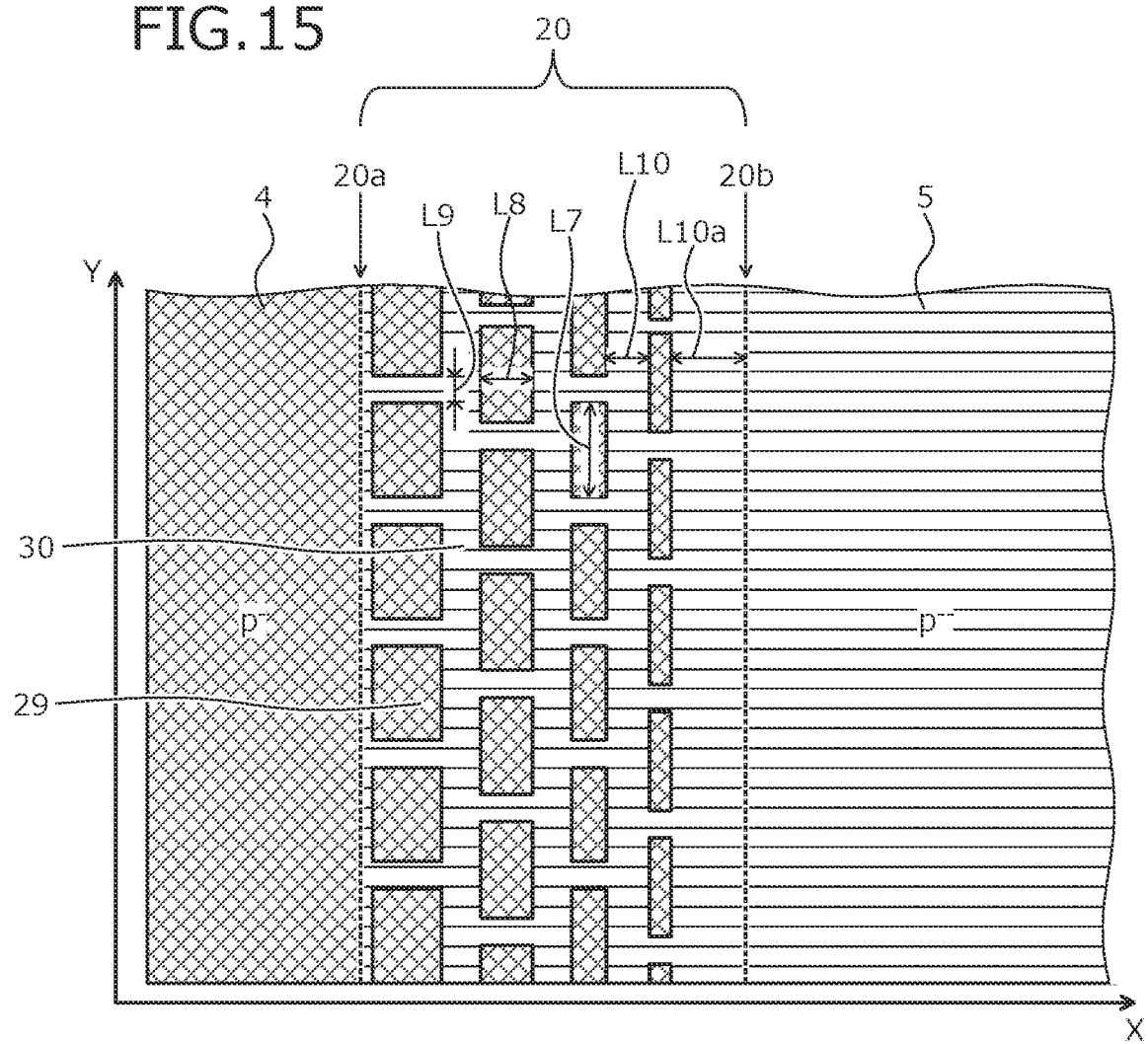

Further examples of the semiconductor device according to the tenth embodiment will be described. FIGS. 14, 15, and 16 are plane views of the further examples of the structure of the semiconductor device according to the tenth embodiment. As depicted in FIG. 14, the intervals L10 between the first subregions 29 neighboring in the normal direction X may be made wider for the first subregions 29 disposed closer to the second JTE region 5. In this case, the planer shape of the first subregions 29 is, for example, a linear shape extending in the tangential direction Y. For example, all the first subregions 29 are equal to each other in terms of the width L7 in the tangential direction Y. For example, all the first subregions 29 are equal to each other in terms of the width L8 in the normal direction X.

As depicted in FIG. 15, the width L8 in the normal direction X of the first subregions 29 may be made narrower in the first subregions 29 disposed closer to the second JTE region 5. In this case, for example, the planer shapes of the first subregions 29 are made closer to a rectangular shape for the first subregions 29 disposed closer to the first JTE region 4 and made closer to a linear shape for the first subregions 29 disposed closer to the second JTE region 5. For example, all the first subregions 29 are equal to each other in terms of the width L7 in the tangential direction Y. For example, the first subregions 29 neighboring in the normal direction X are arranged at the equal intervals L10. A portion of the electric field relaxation region 20 closest to the second JTE region 5 is a region without the first subregions 29 over a comparatively wide width L10a.

As depicted in FIG. 16, for the first subregions 29 disposed closer to the second JTE region 5, both the width L7 in the tangential direction Y and the width L8 in the normal direction X of the first subregions 29 may be made narrower and the intervals L9 between the first subregions 29 neighboring in the tangential direction Y may be made wider. In this case, a portion of the electric field relaxation region 20 closest to the second JTE region 5 is a region without the first subregions 29 over the comparatively wide width L10a. In the further examples of the semiconductor device according to the tenth embodiment depicted in FIGS. 14 to 16, the configuration other than the planar pattern of the first subregions 29 is the same as the semiconductor device according to the tenth embodiment depicted in FIG. 13. The further examples of the semiconductor device according to the tenth embodiment depicted in FIGS. 14 to 16 produce the same effect as the semiconductor device according to the tenth embodiment depicted in FIG. 13. The tenth embodiment may be applied to the eighth embodiment to invert the arrangement of the first subregions and the second subregions.

As described above, according to the tenth embodiment, the same effect as the fourth, eighth, and ninth embodiments may be produced.

Figure 17A:
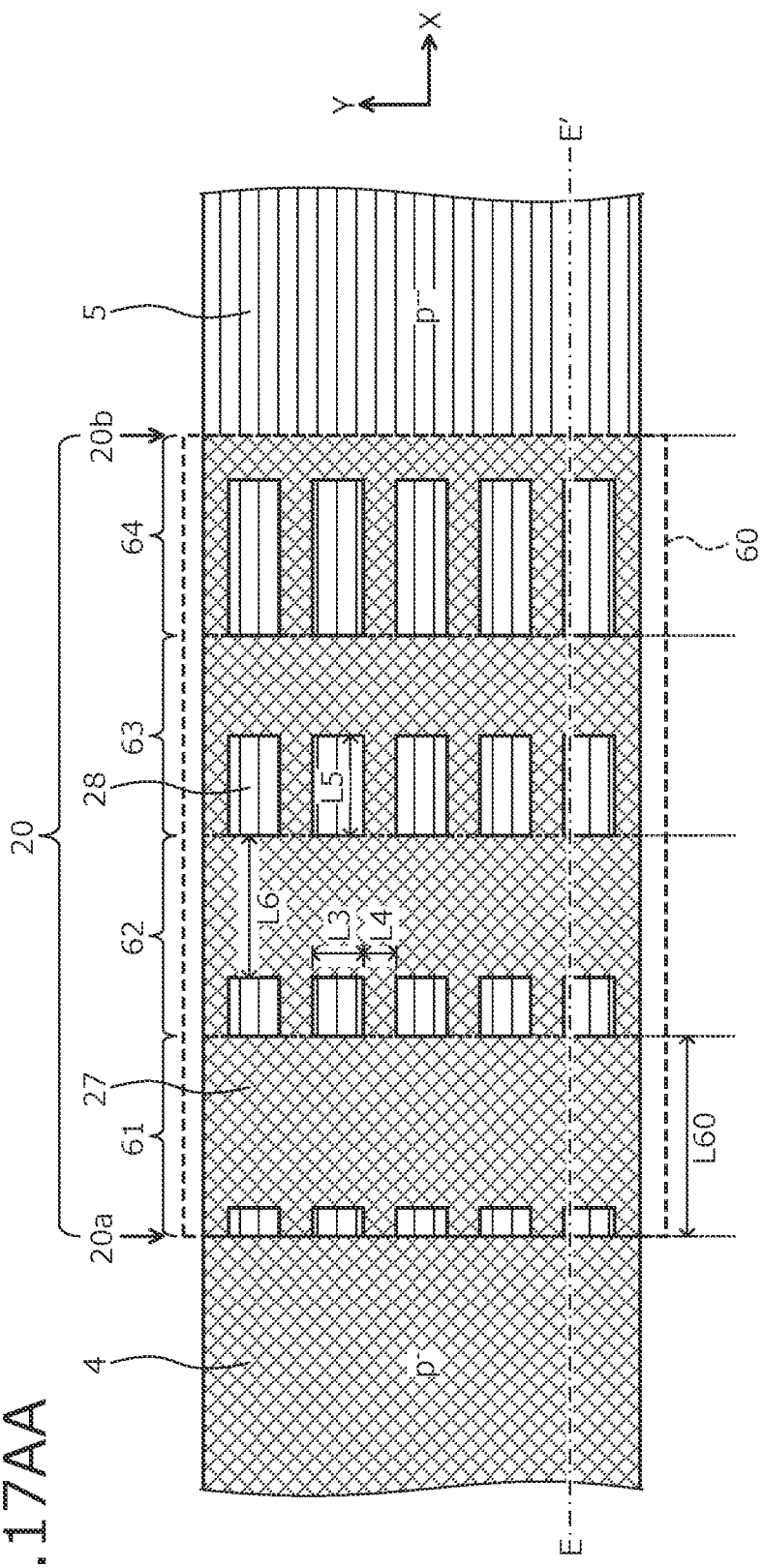
FIGS. 17AA, 17AB, 17BA, and 17BB are explanatory views of a structure of a semiconductor device according to an eleventh embodiment.
Figure 17A:
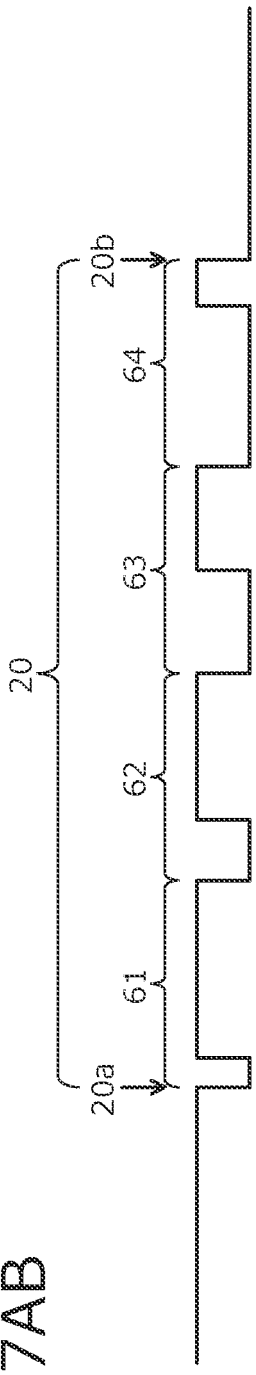

A structure of a semiconductor device according to an eleventh embodiment will be described. FIGS. 17AA, 17AB, 17BA, and 17BB are explanatory views of the structure of the semiconductor device according to the eleventh embodiment. FIGS. 17AA and 17BA depict planar layouts in the linear portion 14a of the JTE structure and FIGS. 17AB and 17BB depict impurity concentration distributions taken along cutting lines E-E' and F-F' of FIGS. 17AA and 17BA, respectively. The semiconductor device according to the eleventh embodiment is different from the semiconductor device according to the eighth embodiment in that the intervals L6 neighboring in the normal direction X of the second subregions 28 arranged in the matrix shape are made narrower for those disposed on the outer side.

As depicted in FIGS. 17AA and 17AB, the width L5 in the normal direction X of the second subregions 28 is made wider in the second subregions 28 disposed on the outer side. The intervals L4 of the second subregions 28 neighboring in the tangential direction Y are constant from the inside to the outside. The electric field relaxation region 20 is divided in the normal direction X into multiple sections (in this example, four sections denoted by reference numerals 61 to 64 from the inside to the outside) and each of the sections 61 to 64 is disposed with a set of a second subregion 28 and a first subregion 27 interposed between the second subregion 28 and a second subregion 28 neighboring thereto on the outside. All the sections 61 to 64 are equal in terms of a sum L60 of the width L5 in the normal direction X of the second subregion 28 and the width (L6) in the normal direction X of the first subregion 27 interposed between the second subregion 28 and the second subregion 28 neighboring thereto on the outside. The first subregions 27 are arranged in a mesh-shaped planar pattern in which stripes extending in the normal direction X and arranged at equal intervals (L3) in the tangential direction Y with the same width (L4) are made orthogonal to stripes extending in the tangential direction Y and arranged at intervals (L5) made wider on the outer side with the width (L6) made wider on the outer side.

The intervals L4 between the second subregion 28 neighboring in the tangential direction Y have a lower limit value determined by the process limit, for example. The average impurity concentration of the sections 61 to 64 is determined by a ratio between the width L5 in the normal direction X of the second subregion 28 and the width (L6) of the first subregion 27 interposed between the second subregion 28 and the second subregion 28 neighboring thereto on the outside. Since the pattern width (L6) in the normal direction X of the first subregions 27 is narrower and the width L5 in the normal direction X of the second subregions 28 is wider in the sections 61 to 64 disposed on the outer side as described, the sections 61 to 64 disposed on the outer side have a lower average impurity concentration and a higher electric field relaxation effect. The electric field relaxation effect can further be increased by making the average impurity concentration differences equal among all the sections 61 to 64 neighboring in the normal direction X.

As depicted in FIGS. 17BA and 17BB, an interval L66 between the second subregions 28 neighboring in the normal direction X, i.e., a pattern width of a stripe portion of the first subregions 27 extending in the tangential direction Y, may be reduced to the process limit. In this case, for example, the inside of each of the sections 62 to 64 of FIGS. 17AA and 17AB may be divided in the normal direction X into multiple parts. For example, in the electric field relaxation region 20 depicted in FIGS. 17BA and 17BB, a set of the second and first subregions 28, 27 having respective widths acquired by dividing the widths in the normal direction X of the second and first subregions 28, 27 of FIGS. 17AA and 17AB by a division number is repeated and disposed in one section by the division number in the normal direction X. FIGS. 17BA and 17BB depict the case of dividing the section 62 into three in the normal direction X, dividing the section 63 into four in the normal direction X, and dividing the section 64 into three in the normal direction X. For example, describing the section 62 divided into three in the normal direction X as an example, a width L65 in the normal direction X of the second subregions 28 in the section 62 of FIGS. 17BA and 17BB is ⅓ of the width L5 in the normal direction X of the second subregion 28 in the section 62 of FIGS. 17AA and 17AB (L65=L5/3). An interval L66 between the second subregions 28 neighboring in the normal direction X in the section 62 of FIGS. 17BA and 17BB is ⅓ of the interval L6 between the second subregions 28 neighboring in the normal direction X in the section 62 of FIGS. 17AA and 17AB (L66=L6/3). A width L63 in the tangential direction Y of the second subregions 28 and an interval L64 between the second subregions 28 neighboring in the tangential direction Y of FIGS. 17BA and 17BB are the same as the width L3 in the tangential direction Y of the second subregions 28 and the interval L4 between the second subregions 28 neighboring in the tangential direction Y, respectively, of FIGS. 17AA and 17AB (L63=L3, L64=L4).

A structure of a further example of the semiconductor device according to the eleventh embodiment will be described. FIGS. 18AA, 18AB, 18BA, and 18BB are explanatory views of the structure of the further example of the semiconductor device according to the eleventh embodiment. FIGS. 18AA and 18BA depict planar layouts in the linear portion 14a of the JTE structure and FIGS. 18AB and 18BB depict impurity concentration distributions taken along cutting lines G-G' and H-H' of FIGS. 18AA and 18BA, respectively. As depicted in FIGS. 18AA and 18BA, the eleventh embodiment may be applied to the ninth embodiment to arrange the first subregions 29 in the matrix shape such that the intervals L10 neighboring in the normal direction X of the first subregions 29 are made wider for those disposed on the outer side.

The width L8 in the normal direction X of the first subregions 29 is made narrower in the first subregions 29 disposed on the outer side. The intervals L9 of the first subregions 29 neighboring in the tangential direction Y are constant from the inside to the outside. Each of the sections 61 to 64 is disposed with a set of a first subregion 29 and a second subregion 30 interposed between the first subregion 29 and a first subregion 28 (or the first JTE region 4) neighboring thereto on the inside. All the sections 61 to 64 are equal in terms of the sum L60 of the width L8 in the normal direction X of the first subregion 29 and the width (L10) in the normal direction X of the second subregion 30 interposed between the first subregion 29 and the first subregion 29 neighboring thereto on the inside in a set of the regions neighboring in the normal direction X. Therefore, the second subregions 30 are arranged in a mesh-shaped planar pattern in which stripes extending in the normal direction X and arranged at the equal intervals (L7) in the tangential direction Y with the same width (L9) are made orthogonal to stripes extending in the tangential direction Y and arranged at the intervals (L8) made narrower on the outer side with the width (L10) made wider on the outer side.

The intervals L9 between the first subregion 29 neighboring in the tangential direction Y have a lower limit value determined by the process limit, for example. The average impurity concentration of the sections 61 to 64 is determined by a ratio between the width L8 in the normal direction X of the first subregion 29 and the width (L10) in the normal direction X of the second subregion 30 interposed between the first subregion 29 and the first subregion 29 (or the first JTE region 4) neighboring thereto on the inside. The pattern width (L10) in the normal direction X of the second subregions 30 are wider and the width L8 in the normal direction X of the first subregions 29 are narrower in the sections 61 to 64 disposed on the outer side as described. Thus, as is the case with the semiconductor device according to the eleventh embodiment depicted in FIGS. 17AA, 17AB, 17BA, and 17BB, the sections 61 to 64 disposed on the outer side have a lower average impurity concentration and a higher electric field relaxation effect.

Figure 18B:
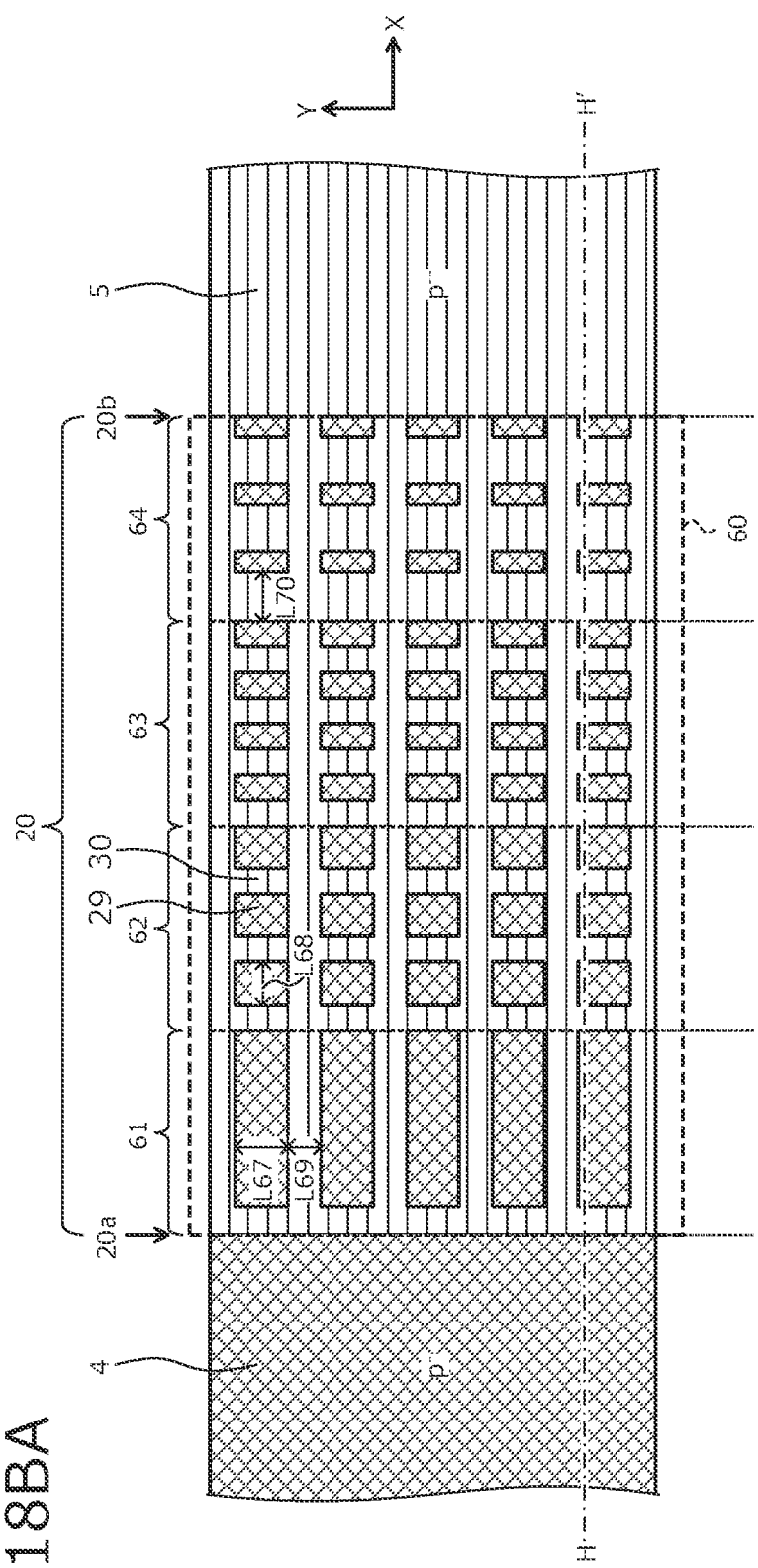
FIGS. 18AA, 18AB, 18BA, and 18BB are explanatory views of a structure of further example of the semiconductor device according to the eleventh embodiment.
Figure 18B:
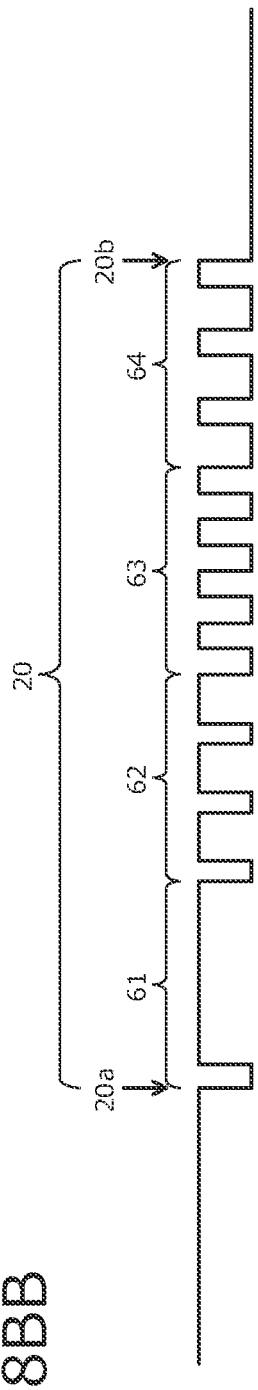

As depicted in FIGS. 18BA and 18BB, an interval L70 between the first subregions 29 neighboring in the normal direction X, i.e., a pattern width of a stripe portion of the second subregions 30 extending in the tangential direction Y, may be reduced to the process limit. In this case, for example, the inside of each of the sections 62 to 64 of FIGS. 18AA and 18AB may be divided in the normal direction X into multiple parts. For example, in the electric field relaxation region 20 depicted in FIGS. 18BA and 18BB, a set of the second and first subregions 30, 29 having respective widths acquired by dividing the widths in the normal direction X of the second and first subregions 30, 29 of FIGS. 18AA and 18AB by a division number is repeated and disposed in one section by the division number in the normal direction X. FIGS. 18BA and 18BB depict the case of dividing the section 62 into three in the normal direction X, dividing the section 63 into four in the normal direction X, and dividing the section 64 into three in the normal direction X. For example, describing the section 62 divided into three in the normal direction X as an example, a width L68 in the normal direction X of the first subregions 29 in the section 62 of FIGS. 18BA and 18BB is ⅓ of the width L8 in the normal direction X of the first subregion 29 in the section 62 of FIGS. 18AA and 18AB (L68=L8/3). An interval L70 between the first subregions 29 neighboring in the normal direction X in the section 62 of FIGS. 18BA and 18BB is ⅓ of the interval L10 between the first subregions 29 neighboring in the normal direction X in the section 62 of FIGS. 18AA and 18AB (L70=L10/3). A width L67 in the tangential direction Y of the first subregions 29 and an interval L69 between the first subregions 29 neighboring in the tangential direction Y of FIGS. 18BA and 18BB are the same as the width L7 in the tangential direction Y of the first subregions 29 and the interval L9 between the first subregions 29 neighboring in the tangential direction Y, respectively, of FIGS. 18AA and 18AB (L67=L7, L69=L9).

As described above, according to the eleventh embodiment, the same effect as the first to tenth embodiments may be produced.

The breakdown voltage of the termination structure portion 12 of the semiconductor device according to an example was verified. FIG. 20 is a characteristic diagram of breakdown voltage characteristics of the termination structure portion of the semiconductor device according to an example. By following the method of manufacturing the semiconductor device according to the fourth embodiment, an SiC-SBD was produced that includes the electric field relaxation region 20 between the first and second JTE regions 4, 5 making up the JTE structure with the two-layer structure (i.e., the semiconductor device according to the third embodiment depicted in FIGS. 5A to 6B) (hereinafter referred to as the example). In the example, while the impurity concentration ratio between the first JTE region 4 and the second JTE region 5 was fixed to 1:0.5, a dose amount of aluminum of the first ion implantation for forming the first JTE region 4 was variously changed to produce multiple samples and the breakdown voltages of the samples were measured. The results are depicted in FIG. 20. In FIG. 20, the breakdown voltage characteristics of a SiC-SBD made up of a conventional JTE structure without the electric field relaxation region 20 are also depicted for comparison. The configuration of the conventional example is the same as the example except that the electric field relaxation region 20 is not included.

From the result depicted in FIG. 20, it is confirmed that the breakdown voltage may decrease in the conventional example depending on the impurity concentration (the dose amount of the first ion implantation) of the first JTE region 4. In contrast, it is revealed that the substantially constant breakdown voltage may be ensured in the example regardless of the impurity concentration of the first JTE region 4 and that a drop in the breakdown voltage occurring in the conventional example is improved. The maximum breakdown voltage of the semiconductor devices is determined by the breakdown voltage on the outside of the JTE structure in the termination structure portion 12. It is presumed that since the disposition of the electric field relaxation region 20 relaxes the electric field between the first JTE region 4 and the second JTE region 5 and distributes the electric field concentration points, the drop in the breakdown voltage does not occur in the example.

The present invention described above can variously be modified without departing from the spirit of the present invention and, for example, the dimensions and the impurity concentrations of the portions are variously be set in the embodiments described above depending on required specifications etc. Although the present invention has been described by taking the SBD as an example, this is not a limitation, and the present invention is applicable to various semiconductor devices including a terminal edge structure portion. For example, the present invention is applicable to metal oxide semiconductor field effect transistors (MOSFETs: insulated gate field effect transistors) and insulated gate bipolar transistors (IGBTs). Although the embodiments has been described by taking as an example the case of using a silicon carbide epitaxial substrate having a silicon carbide epitaxial layer deposited on a silicon carbide substrate, this is not a limitation and, for example, all the regions making up a device may be diffusion regions formed by ion implantation inside a silicon carbide substrate. Although the first conductive type is the n-type and the second conductive type is the p-type in the embodiments, the present invention is implemented in the same way by using the first conductive type as the p-type and the second conductive type as the n-type.

Figure 21A:
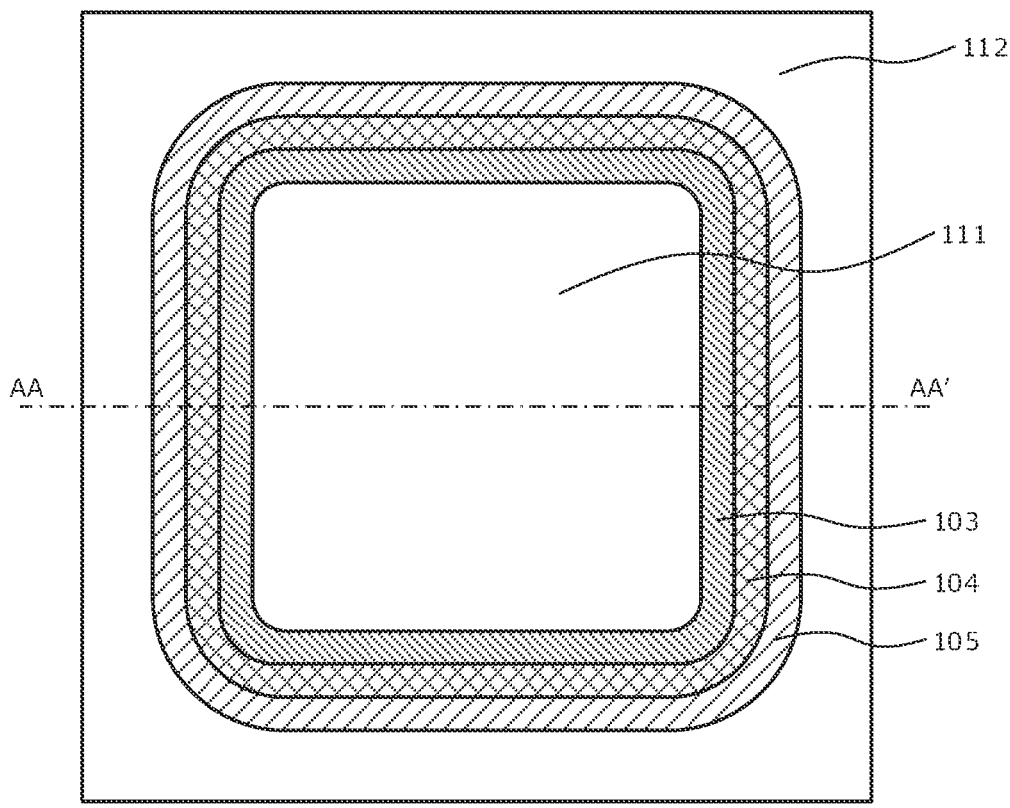
FIGS. 21A and 21B are explanatory views of a conventional SiC-SBD structure.
Figure 21B:
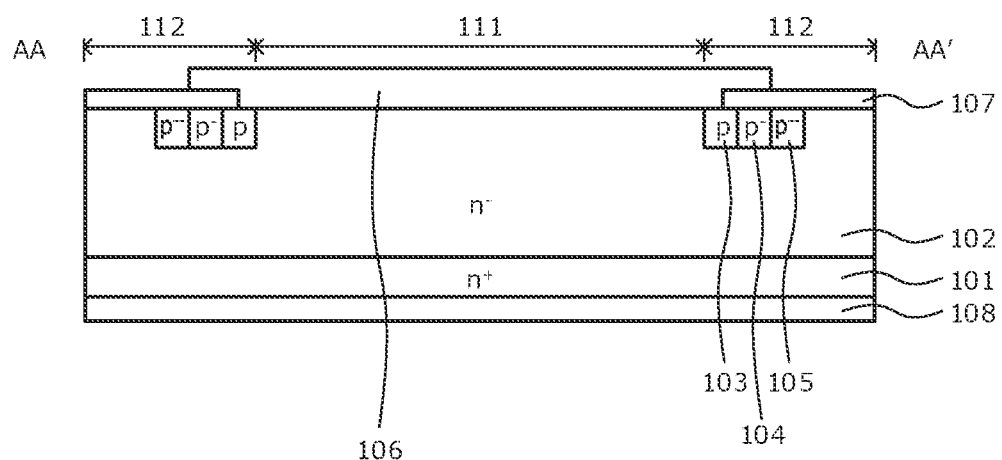
Figure 22A:
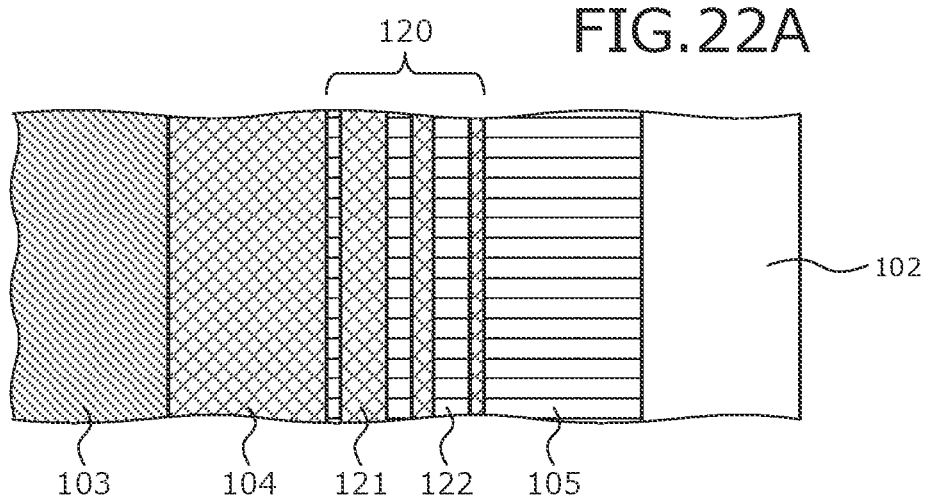
FIGS. 22A and 22B are explanatory views of another example of a conventional SiC-SBD structure.
Figure 22B:
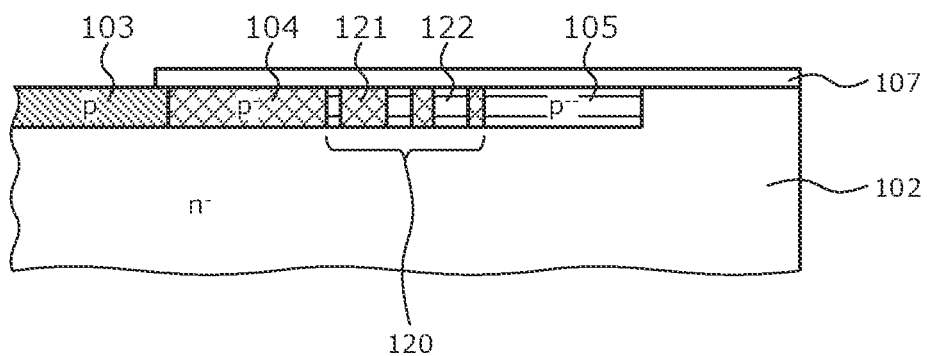
Figure 23A:
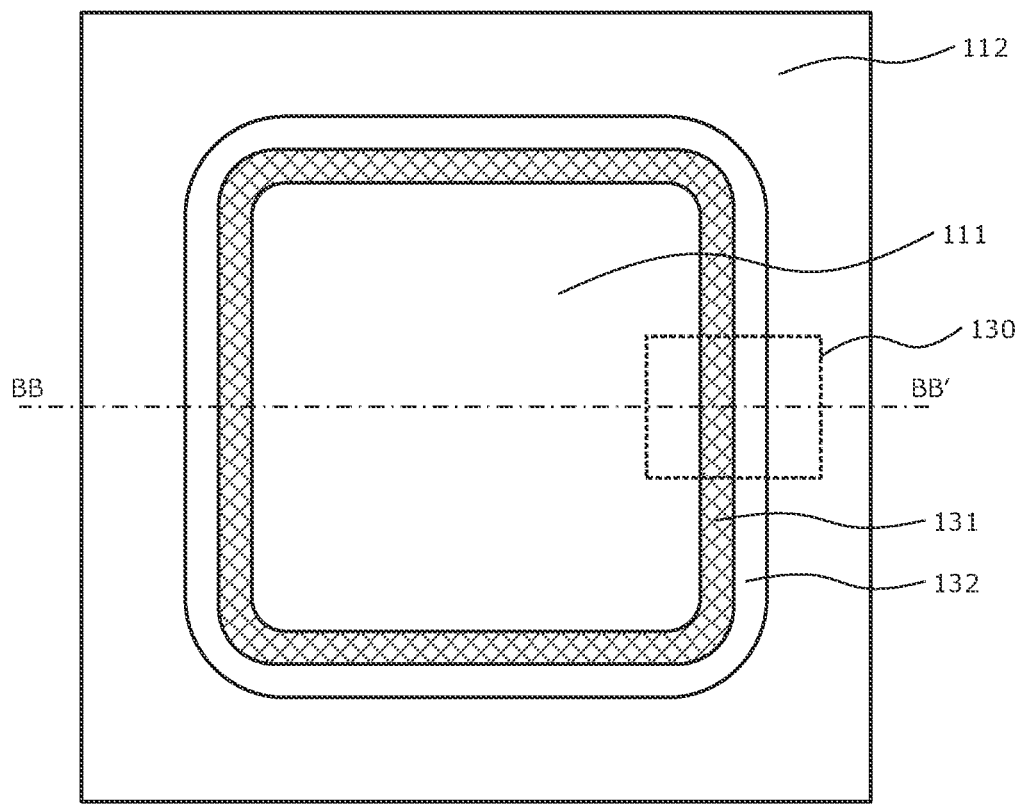
FIGS. 23A and 23B are plane views of another example of a conventional SiC-SBD structure.
Figure 23B:
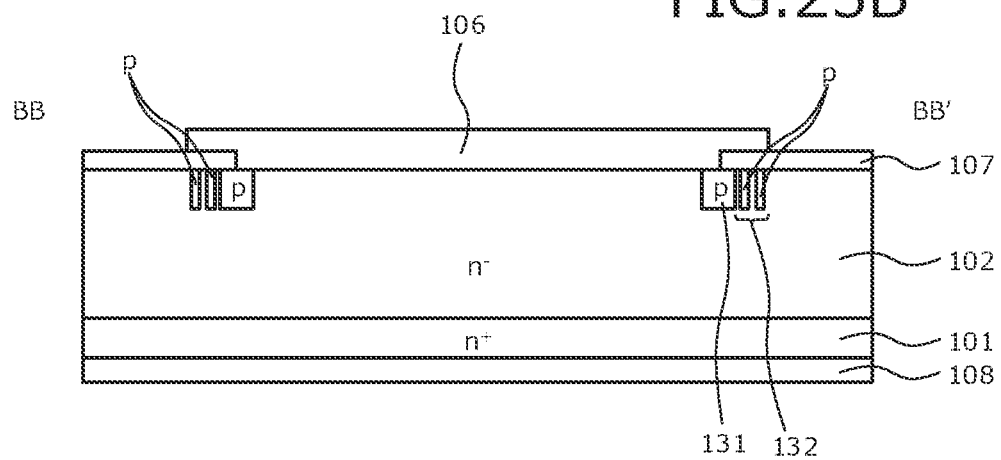

As a result of intensive studies by the inventors, the breakdown voltage may be ensured up to the 1200 V by the JTE structure depicted in FIG. 21; however, it has been confirmed that the electric field concentration becomes significant at a higher breakdown voltage class on the boundary between the first JTE region 104 and the second JTE region 105. The occurrence of the electric field concentration on the boundary between the first JTE region 104 and the second JTE region 105 causes a problem of reduction in manufacturing process margins necessary for ensuring a predetermined breakdown voltage of the termination structure portion. The manufacturing process margins necessary for ensuring a predetermined breakdown voltage of the termination structure portion are margins of the breakdown voltage of the termination structure portion for ion implantation accuracy (a dose amount, a diffusion depth) and an ionic activation rate when a p-type region making up the JTE structure is formed.

The problem related to such manufacturing process margins may be improved by increasing the number of p-type regions making up the JTE structure and by arranging multiple p-type regions such that the p-type regions with a small impurity concentration difference are adjacent to each other, so as to reduce the impurity concentration in stages from the active region 111 side toward the outside. However, the number of processes of photolithography and ion implantation is increased by the increased number of p-type regions making up the JTE structure, leading to a new problem of cost increase.

As described above, the silicon carbide semiconductor must have multiple JTE regions adjacently formed with the impurity concentration made lower in the regions disposed on the outer side so as to improve the breakdown voltage determined by a critical field strength in an outer peripheral portion of a JTE structure and, since an impurity concentration gradient is made discontinuous at boundaries between the JTE regions, concentration of an electric field occurs. With regard to this problem, in Japanese Laid-Open Patent Publication No. 2008-034646 and International Publication No. 2012/049872 (for example, refer to FIG. 20), the p⁻-type subregions 121 and the p⁻-type subregions 122 are alternately repeatedly arranged in a concentric shape with a width narrower than the first and second JTE regions 104, 105 between the first and second JTE regions 104, 105. Since this is equivalent to disposing between the first and second JTE regions 104, 105 the electric field relaxation region 120 having an intermediate impurity concentration between the first and second JTE regions 104, 105, it is presumed that the gradient of impurity concentration reduced from the active region 111 side toward the outside is made gradual in the JTE structure.

The spatial impurity concentration gradient in the entire electric field relaxation region 120 is determined by respective widths of impurity concentration gradients of the p⁻-type subregions 121 and the p⁻-type subregions 122 arranged alternately and an impurity concentration ratio between the p⁻-type subregions 121 and the p⁻-type subregions 122. Particularly, to make the impurity concentration gradient in the electric field relaxation region 120 smaller so as to relax the electric field in the JTE structure, one of the neighboring p⁻-type and p⁻-type subregions 121, 122 must be reduced in width. However, the widths of the p⁻-type subregions 121 and the p⁻-type subregions 122 are determined by dimension accuracy and variation in photolithography. This leads to a low degree of freedom in design, which makes stable formation of the electric field relaxation region 120 having a desired impurity concentration distribution impossible. Therefore, the breakdown voltage of the termination structure portion may not be improved.

According to the invention described above, by disposing the second-conductive type intermediate region between the neighboring second-conductive type semiconductor regions, the impurity concentration gradient between the neighboring second-conductive type semiconductor regions may be made smaller as compared to the case without the second-conductive type intermediate region. As a result, the electric field between the neighboring second-conductive type semiconductor regions may be relaxed and therefore, the critical field strength may be made higher in the outer peripheral portion of the termination structure portion.

The semiconductor device according to the present invention produces an effect that the breakdown voltage of the termination structure portion may be improved.

As described above, the semiconductor device according to the present invention is useful for high-voltage semiconductor devices including the JTE structure and is particularly suitable for 1200 V silicon carbide semiconductor devices or higher (e.g., 1700 V or 3300 V).

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
 a semiconductor substrate;
 an active region formed on a front surface of the semiconductor substrate;
 a termination structure portion formed on the front surface of the semiconductor substrate and surrounding a periphery of the active region, to thereby form a boundary line on the front surface between the active region and the termination structure portion; and
 a third semiconductor region, a first semiconductor region, an intermediate region, and a second semiconductor region, formed in the termination structure portion and concentrically surrounding the boundary line on the front surface in this order, wherein
 the second semiconductor region surrounds the first semiconductor region, an impurity concentration of the second semiconductor region being lower than an impurity concentration of the first semiconductor region,
 the third semiconductor region has an impurity concentration that is different from the impurity concentration of the first semiconductor region, and
 the intermediate region is sandwiched between, and in contact with, the first and second semiconductor regions, the intermediate region including a plurality of first subregions and a plurality of second subregions that are alternately placed along a path in parallel to the boundary line on the front surface between the active region and the termination structure portion, an impurity concentration of each first subregion being the same as that of the first semiconductor region, an impurity concentration of the second subregions being the same as that of the second semiconductor region, each of the first and second subregions having two parallel side surfaces, which are respectively in direct contact with the first and second semiconductor regions.

2. The semiconductor device according to claim 1, wherein
 the third semiconductor region is in contact with the first semiconductor region; and
 each of the first and second subregions is of a rectangular planar shape, which has opposite first and second sides that are respectively in contact with the first and second semiconductor regions.

3. The semiconductor device according to claim 1, wherein
 the third semiconductor region is in contact with the first semiconductor region; and
 each of the first and second subregions is of a trapezoidal planar shape, lower and upper bases of each first subregion, and upper and lower bases of each second subregion, being respectively in contact with the first and second semiconductor regions.

4. The semiconductor device according to claim 1, wherein
 each first subregion is formed of a plurality of first sections that are placed along a first direction from the first semiconductor region to the second semiconductor region,
 of any adjacent two of the first sections, the one of said any adjacent two first sections that is closer to the first semiconductor region has a width, measured in a second direction along the path, that is larger than that of the other of said any adjacent two first sections by a first width difference,
 each second subregion is formed of a plurality of second sections that are placed along the first direction, and
 of any adjacent two of the second sections, the one of said any adjacent two second sections that is closer to the first semiconductor region has a width, measured in the second direction, that is smaller than that of the other of said any adjacent two second sections by a second width difference.

5. The semiconductor device according to claim 4, wherein
 the first width difference is the same for all of the first sections, the second width difference is the same for all of the second sections, and the first and second width differences are equal to each other.

6. The semiconductor device according to claim 4, wherein each of the first and second subregions is divided into a plurality of minute regions, ones of the minute regions in each of the first or second sections having a same impurity concentration.

7. The semiconductor device according to claim 1, wherein between the first subregions and the second subregions, subregions of one type are arranged in a matrix-shaped planar layout, while subregions of the other type are arranged in a mesh-shaped planar layout surrounding the subregions of the one type.

8. The semiconductor device according to claim 7, wherein the intermediate region includes a plurality of unit regions along the path, each unit region including a plurality of sections along a direction from the first semiconductor region to the second semiconductor region, the first and second subregions are divided into a plurality of minute regions, ones of the minute regions in each of the sections having a same impurity concentration, which is higher than that of minute regions in an adjacent section on an outside thereof, and a distance between the minute regions of the one type corresponds to a limit determined by a manufacturing process.

9. The semiconductor device according to claim 8, wherein the subregions of the one type are the first subregions, and the minute regions of the first subregions in one of the sections have a wider width and a narrower distance, with respect to the direction from the first semiconductor region to the second semiconductor region, than the minute regions of the first subregions in a neighboring section thereof on the outside.

10. The semiconductor device according to claim 8, wherein the subregions of the one type are the second subregions, and the minute regions of the second subregions in one of the sections have a narrower width and a wider distance, with respect to the direction from the first semiconductor region to the second semiconductor region, than the minute regions of the second subregions in a neighboring section thereof on the outside.

11. The semiconductor device according to claim 8, wherein a difference between the impurity concentration of the minute regions of said each section and that of the minute regions of said adjacent section remains the same for all of the sections.

12. The semiconductor device according to claim 8, wherein when a width and the impurity concentration of each first subregions are $x_1$ and $n_{p1}$, respectively, and a width and the impurity concentration of the second subregions are $x_2$ and $n_{p2}$, respectively, an average impurity concentration Np of each of the sections satisfies $$Np=((x_1 \times n_{p1})+(x_2 \times n_{p2}))/(x_1+x_2).$$

13. The semiconductor device according to claim 7, wherein portions of the subregions of the other type that are interposed between the subregions of the one type face the subregions of the one type in a direction orthogonal to the boundary line between the active region and the termination structure portion.

14. The semiconductor device according to claim 1, wherein the intermediate region has an average impurity concentration that is an intermediate value between the impurity concentrations of the first and second semiconductor regions.

15. The semiconductor device according to claim 1, wherein the semiconductor substrate is made of silicon carbide.

16. The semiconductor device according to claim 1, wherein the semiconductor substrate is of a first conductivity type, each of the first semiconductor region, the second semiconductor region and the intermediate region is of a second conductivity type, and the first and second conductivity types are respectively one and the other of n-type and p-type.

17. The semiconductor device according to claim 1, wherein, in a depth direction perpendicular to the front surface of the semiconductor substrate, the first and second semiconductor regions are of a same depth.

18. The semiconductor device according to claim 1, wherein each of the first and second semiconductor regions has a uniform impurity concentration in a horizontal direction relative to the front surface of the semiconductor substrate.

* * * * *